(12) United States Patent
Liu et al.

(10) Patent No.: US 8,940,639 B2
(45) Date of Patent: Jan. 27, 2015

(54) METHODS AND STRUCTURES FOR USING DIAMOND IN THE PRODUCTION OF MEMS

(71) Applicant: Analog Devices, Inc., Norwood, MA (US)

(72) Inventors: Fang Liu, Woburn, MA (US); Kuang L. Yang, Newton, MA (US)

(73) Assignee: Analog Devices, Inc., Norwood, MA (US)

( * ) Notice: Subject to any disclaimer, the term of this patent is extended or adjusted under 35 U.S.C. 154(b) by 128 days.

(21) Appl. No.: 13/718,859

(22) Filed: Dec. 18, 2012

(65) Prior Publication Data
US 2014/0220723 A1  Aug. 7, 2014

(51) Int. Cl.
*H01L 21/311* (2006.01)
*B81C 1/00* (2006.01)

(52) U.S. Cl.
CPC .................. *B81C 1/00158* (2013.01)
USPC .... 438/700; 438/311; 438/513; 257/E21.006; 257/E21.055; 257/E21.32; 257/E21.229; 257/E21.277; 257/E21.328

(58) Field of Classification Search
USPC ........... 438/700, 513, 50, 52, 311, 9, 95, 535, 438/687, 688, 706, 745, 931; 257/E21.006, 257/E21.055, E21.32, E21.229, E21.277, 257/E21.328
See application file for complete search history.

(56) References Cited

U.S. PATENT DOCUMENTS

| | | | |
|---|---|---|---|
| 6,613,601 B1 | 9/2003 | Krauss et al. | 438/52 |
| 6,798,029 B2 | 9/2004 | Volant et al. | 257/415 |
| 6,816,301 B1 * | 11/2004 | Schiller | 359/290 |
| 7,238,594 B2 * | 7/2007 | Fonash et al. | 438/478 |
| 7,344,994 B2 | 3/2008 | Krawczyk et al. | 438/710 |
| 7,709,285 B2 | 5/2010 | Van Beek et al. | 438/53 |
| 7,957,091 B2 * | 6/2011 | Hipwell et al. | 360/97.11 |

OTHER PUBLICATIONS

Auciello, O., et al., "Are Diamonds a MEMS' Best Friend?" *IEEE Microwave Magazine*, pp. 61-75; Dec. 1, 2007.
Auciello, O., et al., "Materials Science and Fabrication Processes for a New MEMS Technology Based on Ultrananocrystalline Diamond Thin Films," *Journal of Physics Condensed Matter*, 16, pp. R539-R552, Dated: 2004.
Ding, et al., "Micromachining of CVD Diamond by RIE for MEMS Applications," *Diamond & Related Materials*, 14, pp. 1543-1548, Dated: 2005.
Krauss, A.R., et al., "Ultrananocrystalline Diamond Thin Films for MEMS and Moving Mechanical Assembly Devices," *Diamond and Related Materials*, 10, pp. 1952-1961, Dated: 2001.
Kusterer, J., et al., "Mechanical Microactuators Based on Nancrystalline Diamond Films," *New Diamond and Frontier Carbon Technology*, vol. 16, No. 6, pp. 295-321, Dated: 2006.
Mousinho, A.P., et al., "Micro-Machine Fabrication Using Diamond-Like Carbon Films," *Diamond and Related Materials*, 12, pp. 1041-1044, Dated: 2003.

* cited by examiner

*Primary Examiner* — David Nhu
(74) *Attorney, Agent, or Firm* — Sunstein Kann Murphy & Timbers LLP

(57) ABSTRACT

A MEMS device with movable MEMS structure and electrodes is produced by fabricating electrodes and shielding the electrodes with diamond buttons during subsequent fabrication steps, such as the etching of sacrificial oxide using vapor HF. In some embodiments, the diamond buttons are removed after the movable MEMS structure is released.

20 Claims, 18 Drawing Sheets

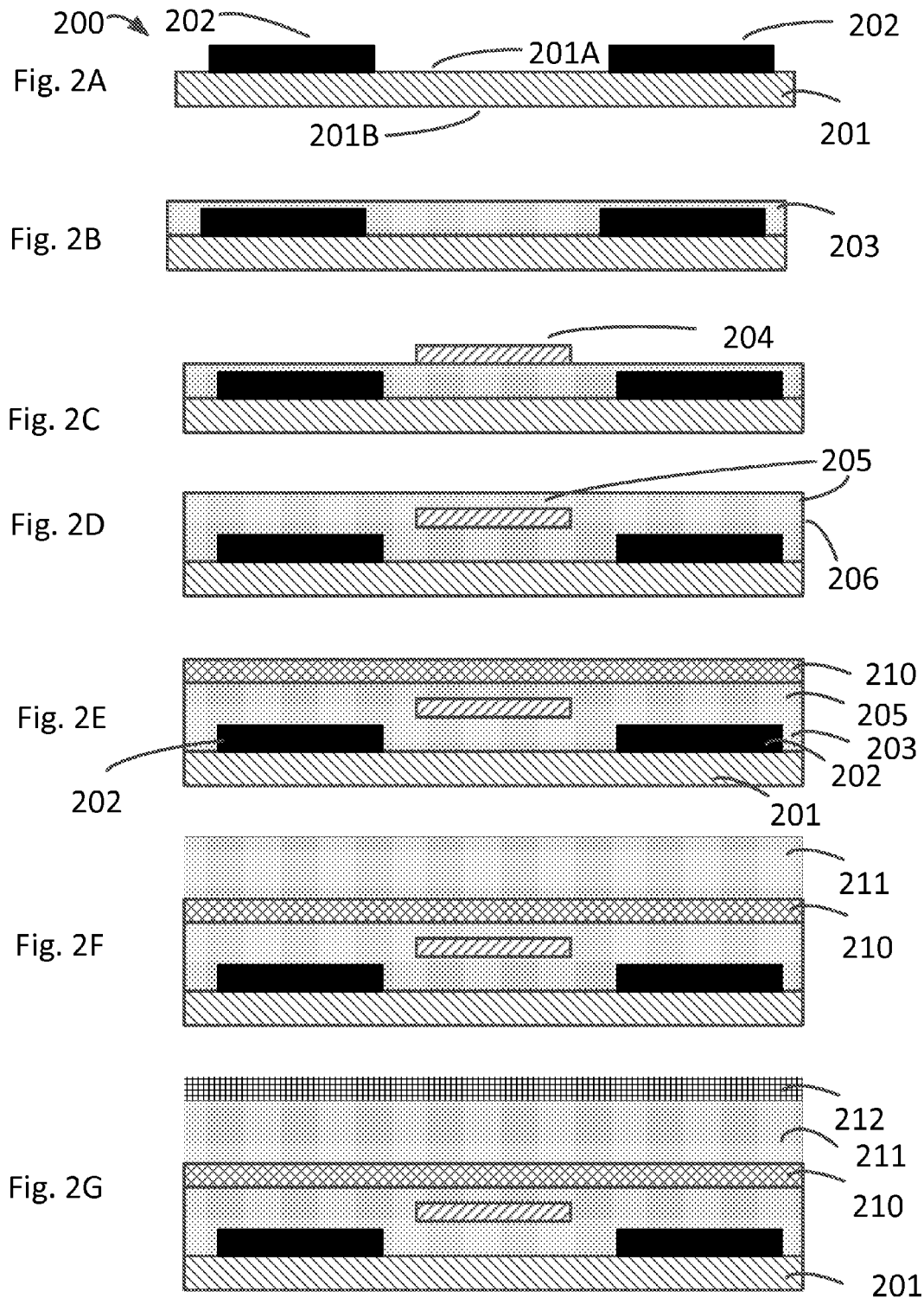

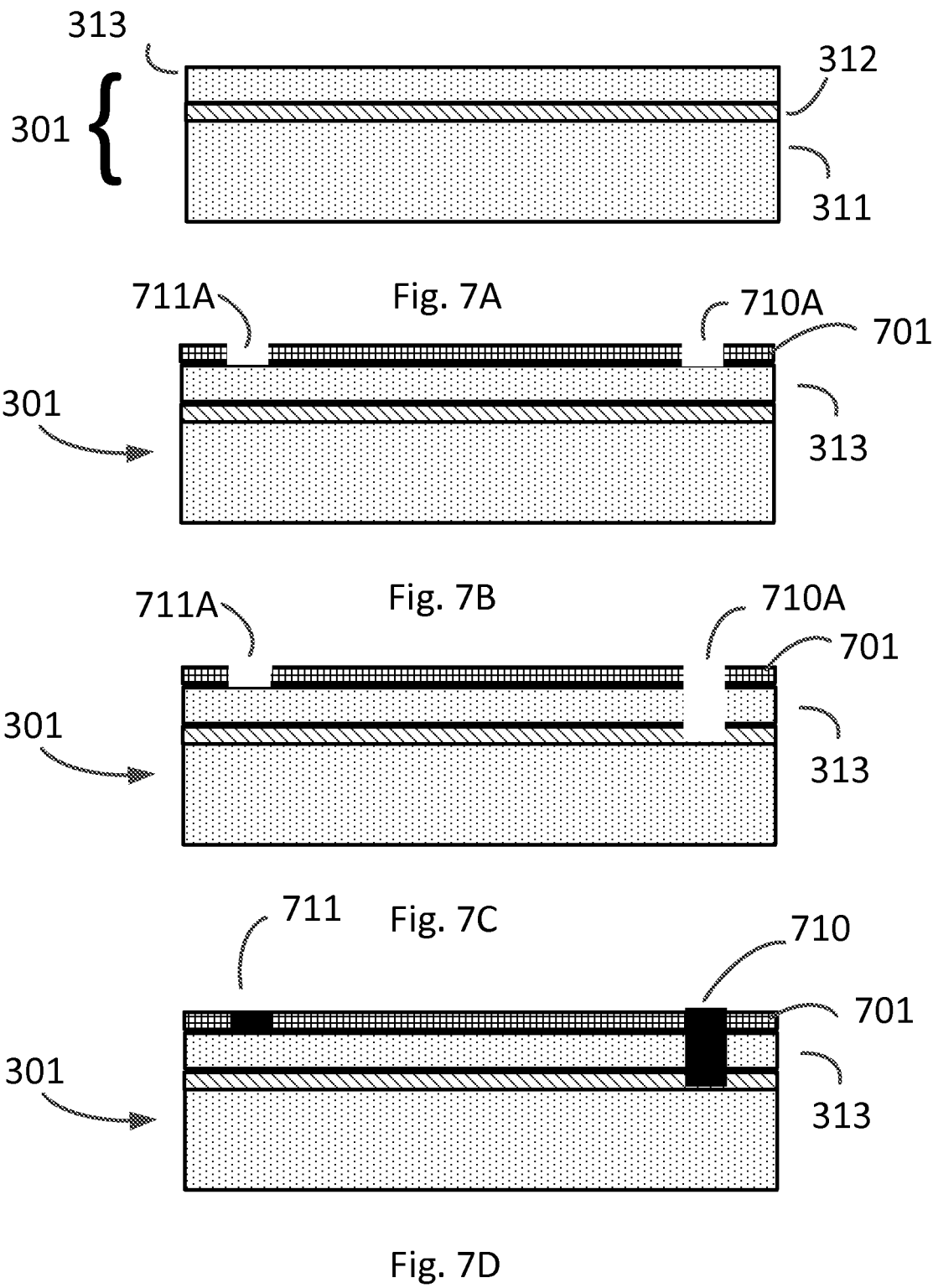

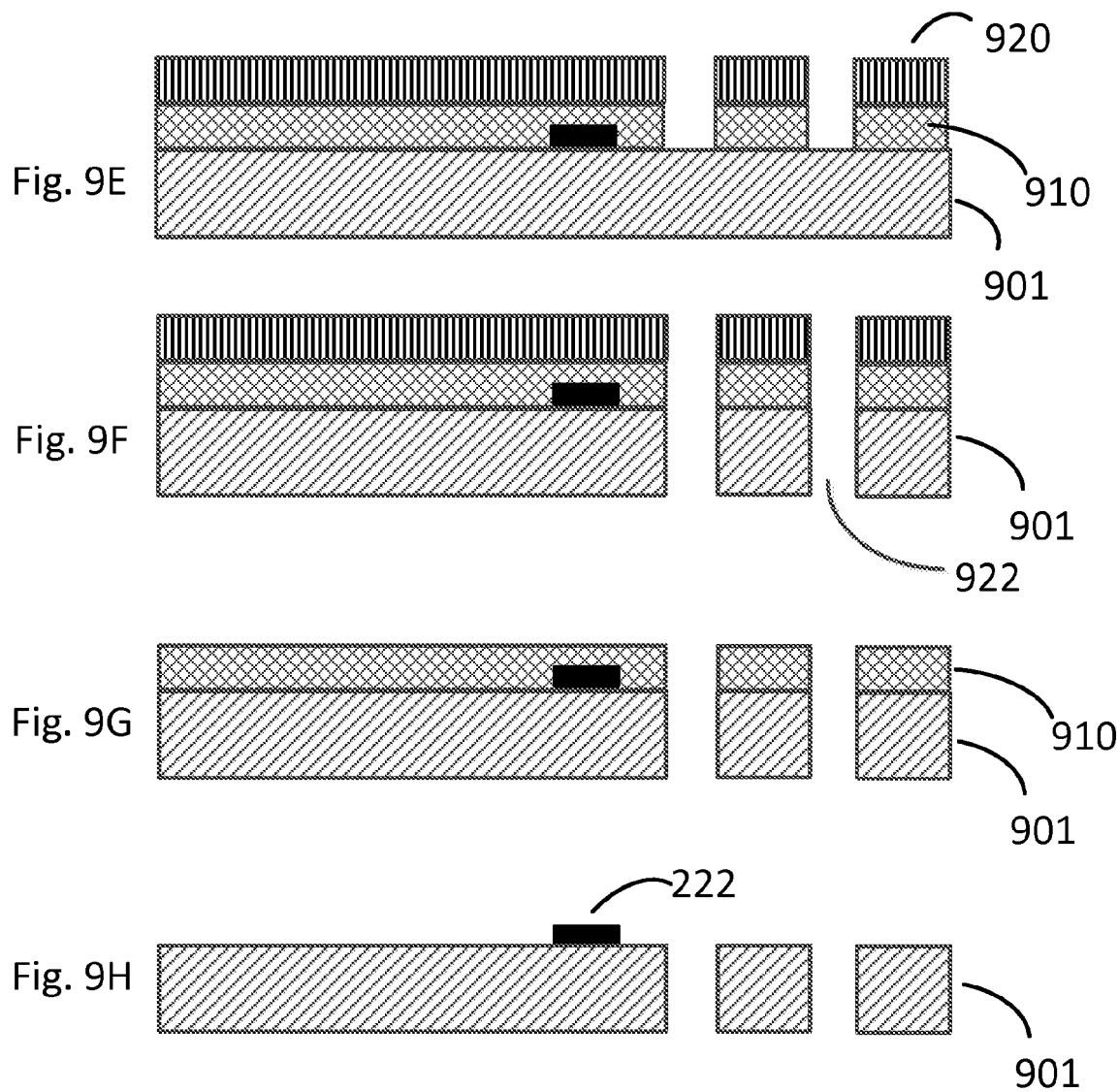

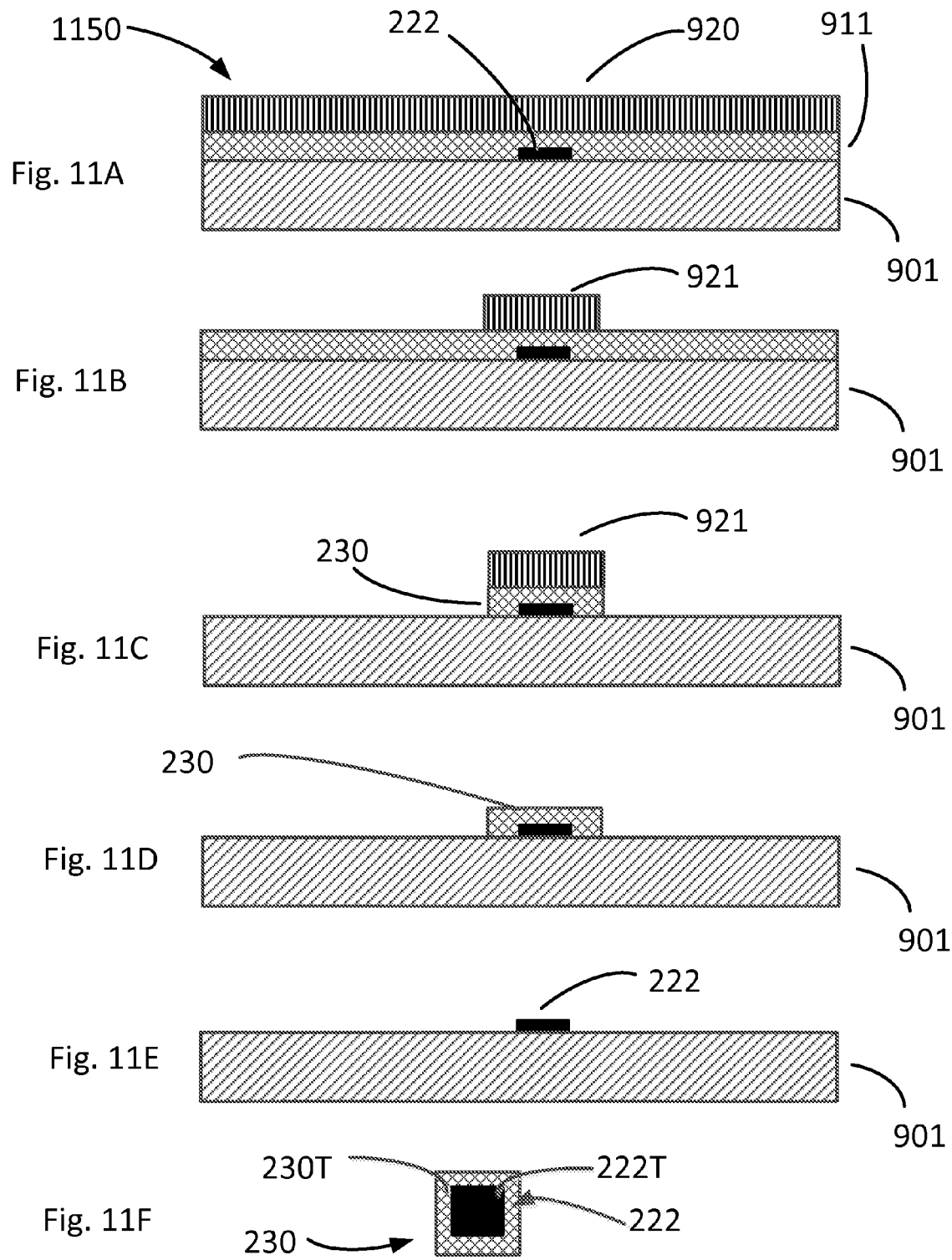

METHODS AND STRUCTURES FOR USING DIAMOND IN THE PRODUCTION OF MEMS

TECHNICAL FIELD

The present invention relates to micro-electro-mechanical devices, and more particularly to the fabrication of such devices.

BACKGROUND ART

It is known in the prior art to form a suspended structure in a micro-electromechanical ("MEMS") device by forming the structure on a sacrificial material, and then removing the sacrificial material to release the suspended structure. For example, the MEMS structure may be released by etching away the sacrificial material using an etchant. The release process may require that the etchant has a high etch rate and high selectivity for the sacrificial material. Preferably, the etching process does not attack, dissolve, or destroy other exposed structure materials.

Some processes use "vapor HF" in which the etchant is hydrofluoric acid, "HF"). This is a type of "dry release" process sometimes used to avoid stiction between the suspended structure and other portions of a MEMS devices during fabrication. Thus, such structures are often coated with a passivation layer that can either remain on the structure or be removed after the release process. However, photoresist may not be a desirable material for a passivation layer in some circumstances, because it may swell after saturation by vapor HF, and may peel off of the structure being fabricated. Also, low stress nitride ("LSN") may not be a desirable material for a passivation layer in some circumstances because it is subject to being etched by vapor HF vapor and may form residues. In addition, LSN is not easy to remove, and materials for etching LSN may attack other layers of the device being fabricated, such as oxide, silicon and metals. Among other things, LSN is not practical for use in protecting metal parts of a device being fabricated.

SUMMARY OF THE EMBODIMENTS

In a first embodiment of the invention, a method of forming a MEMS device begins by providing a substrate having a first side and a second side. The method also forms an electrode or a metal contact on or above the first side of the substrate; provides a diamond layer (or diamond button) on the electrode or metal contact; forms a sacrificial layer on or above the first side of the substrate; forms a MEMS structure on the sacrificial layer such that the sacrificial layer is between the MEMS structure and the substrate; and etches the sacrificial layer with an etchant, such that at least a portion of the sacrificial layer between the MEMS structure and the first side of the substrate is removed prior to removing the diamond layer on the electrode or metal contact. In various embodiments, the electrode or metal contact may be a bottom electrode, for example at a level nearer the substrate than the MEMS structure. In some embodiments, the electrode or metal contact may be on the MEMS structure.

The method may also remove at least a portion of the diamond layer after etching the sacrificial layer. For example, a portion of the diamond layer may be removed by exposing it to oxygen plasma.

In some embodiments, the etchant is such that the diamond layer is not etched by the etchant. For example, in the etchant may be vapor HF.

If the substrate is a silicon-on-insulator wafer, the method may form an electrode or a metal contact on or above the first side of the substrate by forming the electrode or metal contact through the top layer of the silicon on insulator wafer. Forming the electrode or metal contact may be done after forming the MEMS structure on the sacrificial layer.

In various embodiments, providing a diamond layer on the metal contact may include depositing a diamond layer on the MEMS structure and on the metal contact; and removing the majority of the diamond layer to leave a portion of the diamond layer on the metal contact.

A diamond layer may be provided in a number of ways, such as via microwave plasma chemical vapor deposition; via hot filament chemical vapor deposition; via microwave plasma enhanced vapor deposition; or via a spin coating method, to name but a few examples.

Also, the diamond layer may have a thickness of about 50 nm, or a thickness of between about 50 nm and 1,000 nm.

The diamond layer may have the crystal structure of a diamond, but could also have a nanocrystalline structure or a microcrystalline structure, an ultrananocrystalline structure, or even a polycrystalline structure.

In another embodiment, a method of forming a MEMS device includes providing a substrate having a handle layer, a device layer, and a buried oxide layer sandwiched between the handle layer and the device layer; forming a metal contact on or through the device layer; covering the metal contact with a diamond shield; and removing at least a portion of the buried oxide layer by exposing the buried oxide layer to vapor HF. The step of covering the metal contact may include depositing a diamond layer above the device layer, such that the device layer is between the diamond layer and the buried oxide layer; and the step of removing at least a portion of the buried oxide layer may include patterning the diamond layer to form an aperture through the diamond layer to expose at least a portion of the device layer, and exposing at least a portion of the buried oxide layer to vapor HF through the device layer. In alternate embodiment, the step of removing at least a portion of the buried oxide layer may include forming a backside cavity through the handle layer, and exposing at least a portion of the buried oxide layer to vapor HF through the backside cavity.

In another embodiment, a method of forming a MEMS device, includes providing a substrate having a first side and a second side; forming a sacrificial layer on the first side of the substrate; forming a MEMS structure on the sacrificial layer, such that the sacrificial layer is sandwiched between the MEMS structure and the substrate; forming an electrode or a metal element or doped polysilicon element; depositing a diamond layer covering the an electrode or metal or polysilicon element and at least part of the sacrificial layer; depositing mask layer, such as an oxygen plasma resistant layer for example, on the diamond layer; patterning the mask layer to form one or more apertures so as to expose at least a portion of the diamond layer above the sacrificial layer; patterning the diamond layer to form release holes by exposing the diamond layer to oxygen plasma through the mask (e.g., oxygen plasma resistant) layer, so as to expose at least part of the sacrificial layer; and removing at least a portion of the sacrificial layer by exposing the sacrificial layer to vapor HF. The oxygen plasma resistant layer may be an oxide, for example. In some embodiments, the diamond layer covering the electrode may be a diamond button.

BRIEF DESCRIPTION OF THE DRAWINGS

The foregoing features of various embodiments will be more readily understood by reference to the following detailed description, taken with reference to the accompanying drawings, in which:

FIGS. 7A-7H schematically illustrate MEMS device at various stages of fabrication according to the method of FIG. 6;

FIGS. 9A-9H schematically illustrate a device at various stages of fabrication according to the method of FIG. 8;

FIGS. 11A-11F schematically illustrate a device having a diamond shield structure at various stages of fabrication.

DETAILED DESCRIPTION OF VARIOUS EMBODIMENTS

In various embodiments, a MEMS fabrication process protects metal or other device components by shielding them with a layer of diamond or other carbon or diamond-like material. In the fabrication process, the diamond shielding can be deposited on the MEMS device and removed from the MEMS device using processes and temperatures that are compatible with the components of the MEMS device. For example, in some embodiments the shielding layer can be deposited at temperatures of about 400 degrees C., and removed by exposure to oxygen plasma, such that metal structures and other structure and components of the MEMS device are not damaged by the deposition or removal of the shield layer.

Figure 1:
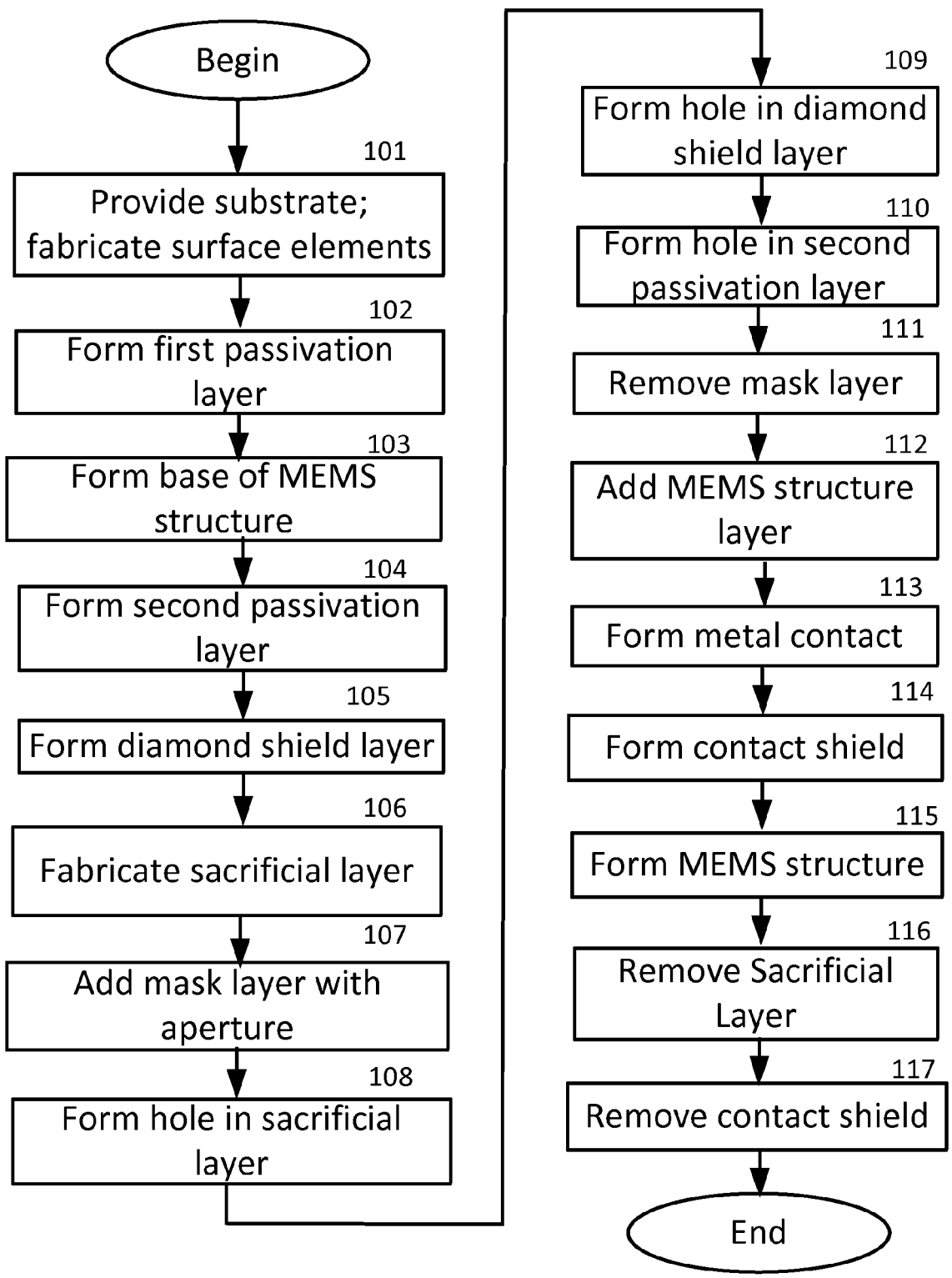
FIG. 1 illustrates a method of forming a MEMS device using a diamond shield.
Figure 2H:
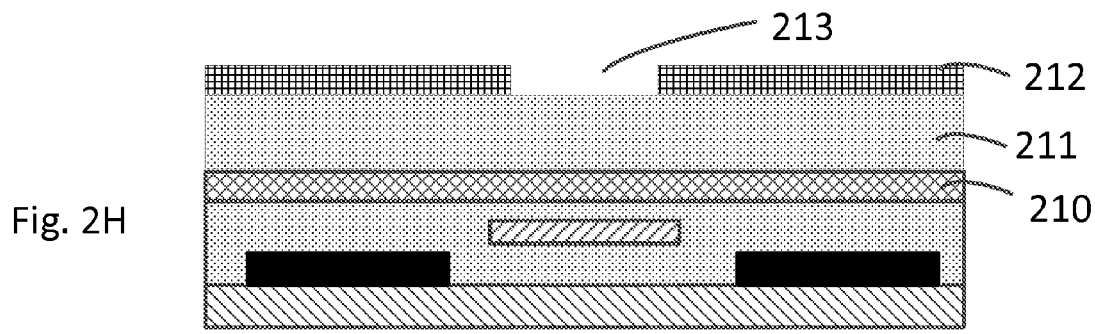
FIGS. 2A-N and 2P-2T schematically illustrate a MEMS device at various stages of fabrication according to the method of FIG. 1 (there is no FIG. 2O)
Figure 2I:
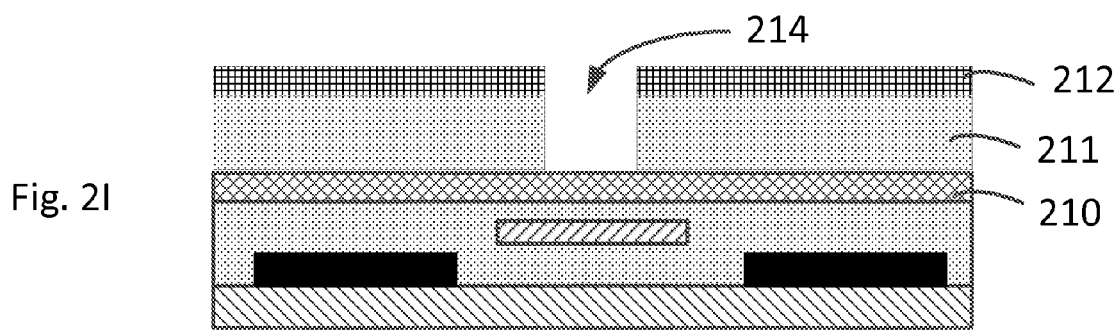
Figure 2J:
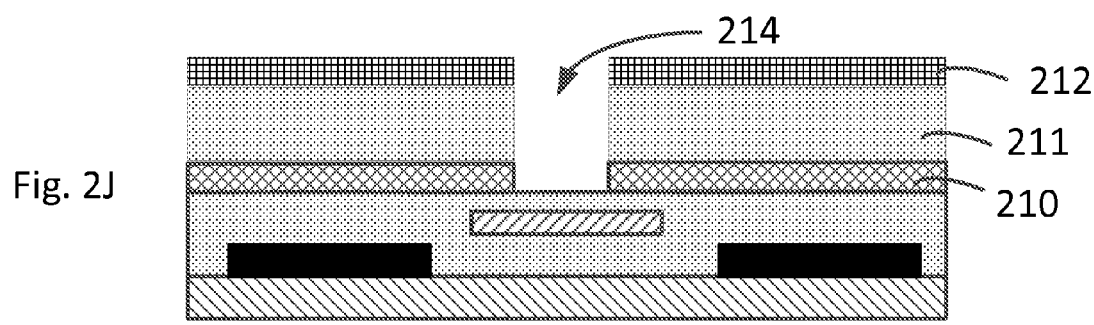
Figure 2K:
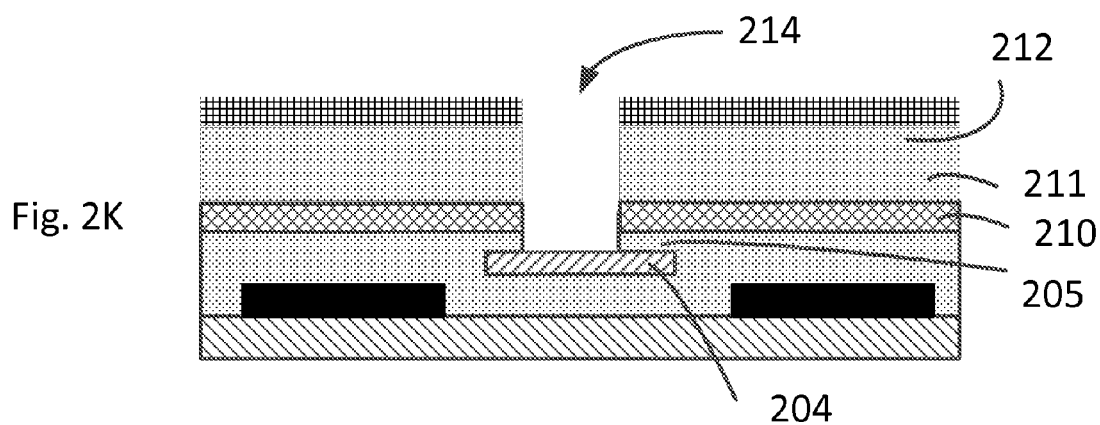
Figure 2L:
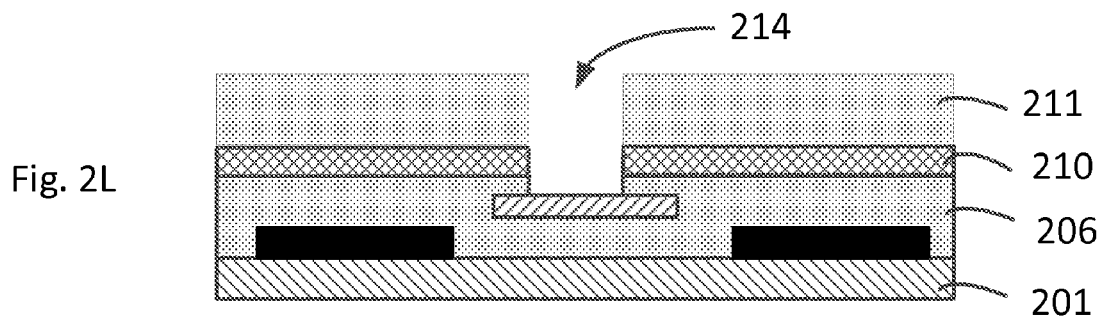
Figure 2M:
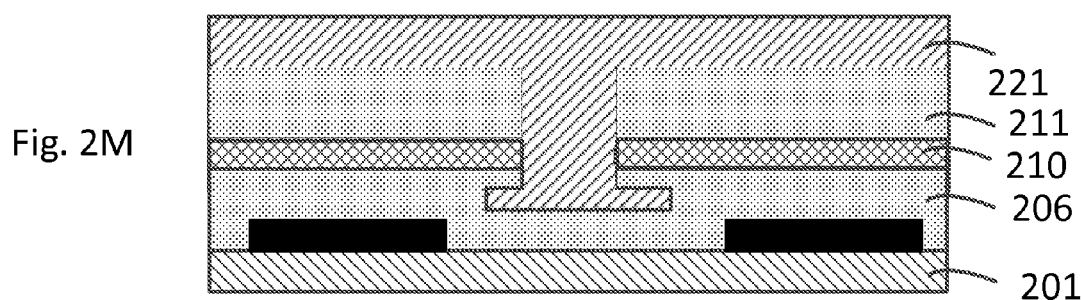
Figure 2N:
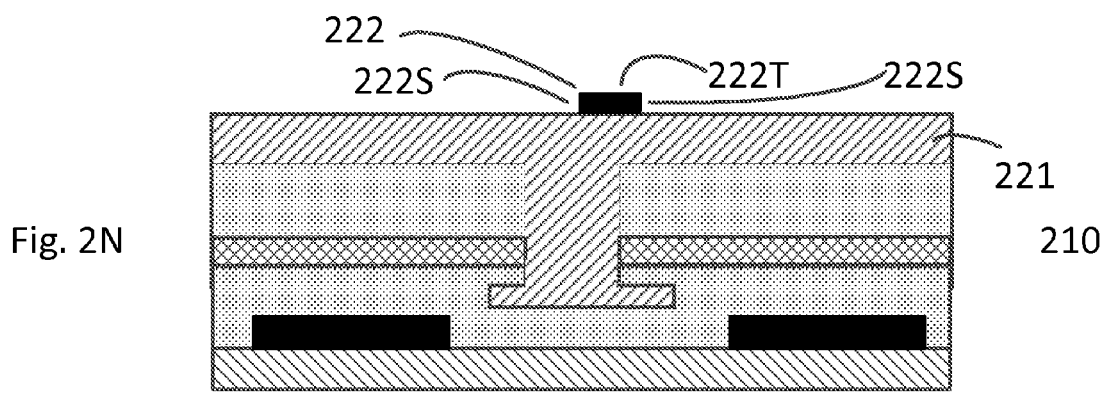
Figure 2P:
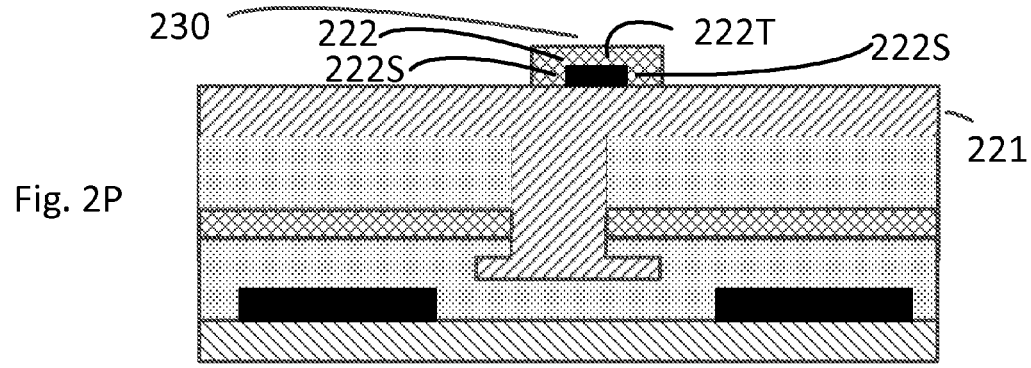
Figure 2Q:
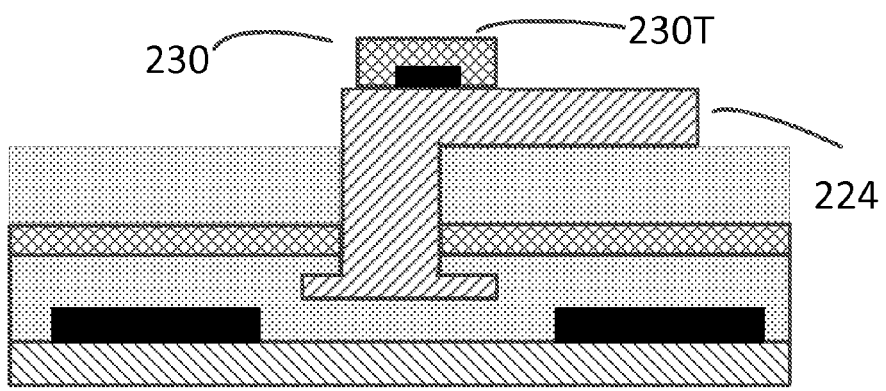
Figure 2R:
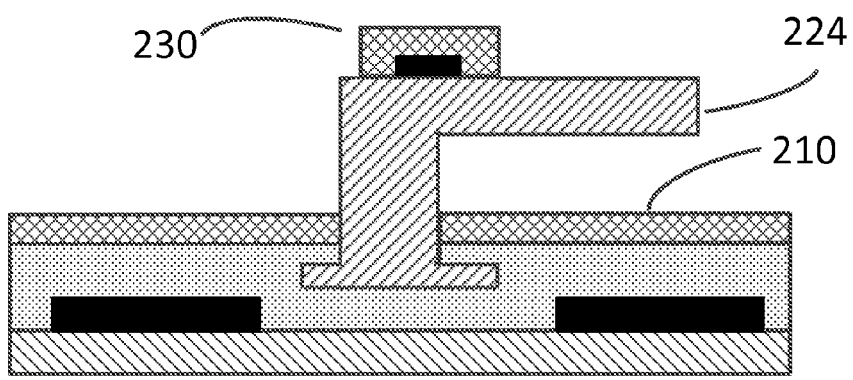
Figure 2S:
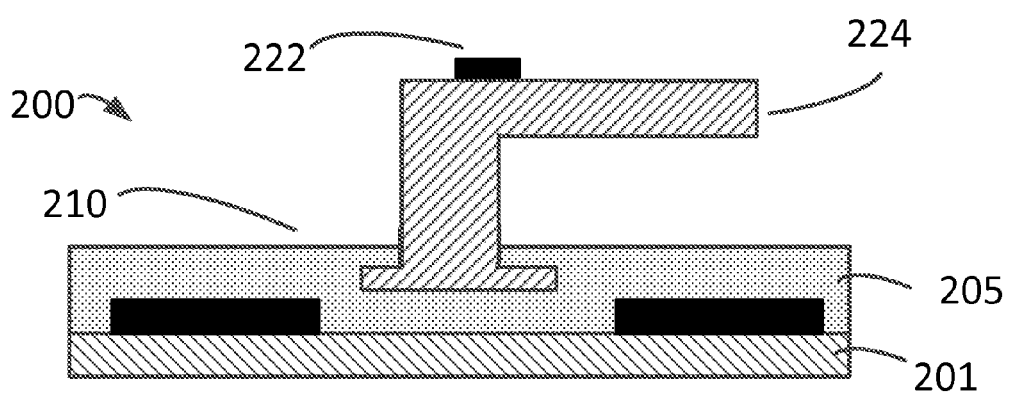
Figure 2T:
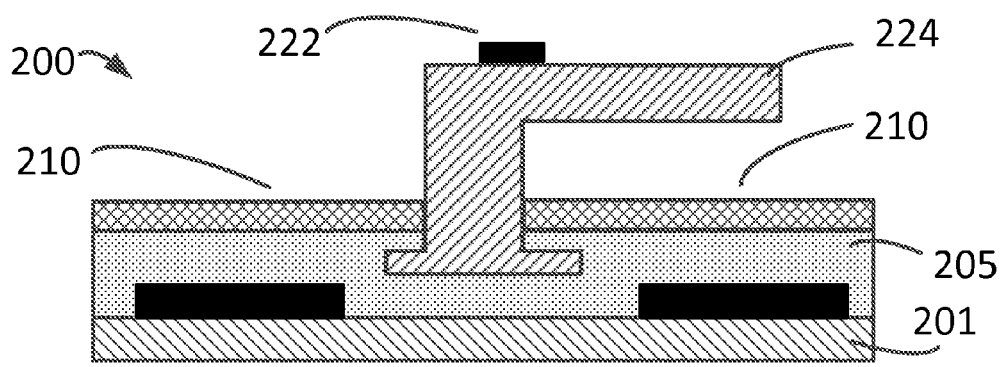

A first embodiment of a method 100 of fabricating a MEMS device 200 with a cantilevered beam is illustrated in FIG. 1. In this illustrative embodiment, the MEMS device is described as a MEMS switch 200, although it could also be an accelerometer, or other MEMS device, for example. Illustrations of the MEMS switch 200 at various stages of fabrication are schematically illustrated in FIGS. 2A-2T.

The method 100 begins with a substrate 201, which may include various surface components 202 on its top surface 201A, or onto which or into which various surface components 202 may optionally be fabricated (step 101; FIG. 2A). The substrate 201 may be a doped or un-doped silicon wafer, for example, although substrates of other materials could be used. The substrate 201 has a first side (e.g., top surface) 201A, and a second side (e.g., bottom surface 201B). The various surface components 202 may be fabricated on the surface of, or within, the substrate, and may include circuitry, such as semiconductor elements, conductive (e.g., metal or doped polysilicon) electrodes or contact pads for electrically coupling the MEMS device, or conductive interconnectors, to name but a few examples. Conductive pads and conductive interconnectors may be made from various metals, as known in the semiconductor industry for example.

A first passivation layer 203 may optionally be formed on the top surface of the substrate (step 102; FIG. 2B). For example, in embodiments that include surface components 202, such a passivation layer may cover the surface components 202 and protect the surface components 202 during subsequent fabrication steps. The first passivation layer 203 may be fabricated from a variety of materials, such as an oxide for example.

Next, a base 204 for a MEMS structure is fabricated on the first passivation layer 203 (step 103; FIG. 2C). Alternately, if the device being fabricated does not have a first passivation layer 203, then the base 204 may be fabricated directly on the surface 201A of the substrate.

Then, a second passivation layer 205 is formed to cover the base 204 (step 104; FIG. 2D). The second passivation layer 205 may be fabricated from a variety of materials, such as an oxide for example. If the device being fabricated includes a first passivation layer 203, and if the second passivation layer 205 includes the same material the first passivation layer 203 (e.g., oxide), then the second passivation layer 205 may integrate with the first passivation layer 203 for form a compound passivation layer 206.

Subsequently, a first diamond shield layer 210 is fabricated above the second passivation layer 205 (step 105; FIG. 2E). As shown in FIG. 2E, the surface components 202, the first passivation layer 203, the second passivation layer 205, and the first diamond shield layer 210 are all on the same side of the substrate 201. Stated alternately, the first passivation layer 203 and second passivation layer 205 are sandwiched between the substrate 201 and the first diamond shield layer 210.

The first diamond shield layer 210 may be carbon having a crystal structure of a diamond 210, but may also have a variety of other structures. In various embodiments, the diamond shield layer 210, which may be referred-to as a "diamond film," (and structures fabricated from such a diamond shield layer 210), may have a nanocrystalline, ultrananocrystalline, microcrystalline, or polycrystalline structure, for example. In other embodiments, the diamond film 210 may be described as "diamond like carbon" ("DLC") with the relative amount of $sp^3$ to $sp^2$ bonding between 100%-10%. The diamond shield layer 210 may have a thickness (as measured in a direction normal to its surface) of 50 nm-1000 nm, for example.

The diamond shield layer 210 may be fabricated by a variety of processes. For example, in various embodiments the diamond film 210 may be prepared by microwave plasma chemical vapor deposition (CVD), hot filament CVD, plasma enhanced CVD, or a spin-coating method followed by anneal. Other embodiments may fabricate a diamond film using a sol-gel method. The deposition (or growth) temperature may be between 300° C.-1000° C. In some embodiments, the temperature at which the diamond film is fabricated may be chosen towards the lower end of the scale, such that the heat does not damage features (e.g., surface components 202) fabricated prior to the fabrication of the diamond film 210. For example, in some embodiments the shielding layer can be deposited at temperatures of about 400 degrees C. by microwave CVD.

After the diamond shield layer 210 is fabricated, a sacrificial layer 211 is fabricated on the diamond shield layer 210 (step 106; FIG. 2F). The sacrificial layer 211 may be a variety of materials known within the MEMS industry, such as an oxide for example.

Next, the sacrificial layer 211 is patterned, to prepare for the fabrication of the MEMS structure. At step 107 (FIG. 2G), a mask layer 212 is fabricated on the sacrificial layer 211. The mask layer 212 includes a mask aperture 213 in the area where the MEMS structure is to be anchored (FIG. 2H).

A portion of the sacrificial layer 211 is then removed (step 108; FIG. 2H), to form a trench 214 down to the diamond shield layer 210 (FIG. 2I). The sacrificial material 211 may be removed, for example, by exposing the sacrificial layer 211 to an etchant that will remove the sacrificial layer 211 below the aperture. Similarly, the method 100 removes a portion of the diamond shield layer 210 (step 109; FIG. 2J) to continue the trench 214 down to the second passivation layer 205. Then, the method 100 continues by removing a portion of the second passivation layer 205 (step 110; FIG. 2K) to continue the trench 214 and to expose the base 204. The method 100 then continues by removing the mask layer 212, thereby exposing the top of the sacrificial layer 211 (step 111; FIG. 2L).

A MEMS structure layer 221 is then fabricated (step 112; FIG. 2M) by filling the trench 214 with a MEMS structure material 221, which also covers a portion of the sacrificial layer 211 (FIG. 2M). The base 204, as well as the MEMS structure material 221, may be polysilicon, for example, or other material that is not subject to etching by the process or materials (e.g., etchant) that will later be used to remove the sacrificial layer 211.

Next, a metal contact 222 is fabricated on the additional MEMS structure 220 (step 113; FIG. 2N). As such, metal contact 222 is fabricated on or above the first side 201A of the substrate. The metal contact 222 may be fabricated in ways known in the art, and from materials known in the art, such as aluminum, copper or an Al/Cu alloy, to name but a few. In some embodiments, the metal contact 222 may be formed by depositing a top mask layer on the additional MEMS structure 220, and patterning the top mask layer to form a contact depression in the desired location of the metal contact 222. Then, metal may be deposited to fill the contact depression, after which the top mask layer is removed. Although various embodiments disclosed herein include a metal contact 222, in other embodiments, element 222 may be an electrode or other conductive element, such a doped polysilicon contact or electrode, or conductive interconnection structure, for example. As such, metal contacts 222 are described for illustrative purposes only, with the understanding that other structures are within the scope of this disclosure.

To protect the metal contact 222 during other fabrication steps, the method 100 forms a diamond contact shield (or "diamond button") 230 covering the metal contact 222 (step 114; FIG. 2P). As schematically illustrated in the embodiment of FIG. 2P, for example, the contact shield 230 covers all surfaces of the metal contact 222 that were exposed prior to fabrication of the contact shield 230. For example, in FIG. 2P, the diamond contact shield 230 covers the top (222T) of the metal contact 222 and the sides (222S) of the metal contact 222. In some embodiments, the diamond contact shield 230 is only large enough to cover the element to be protected (e.g., metal contact 222), for example in order to leave as much as possible of the remaining structure exposed. For example, in some embodiments the top surface (230T) of the diamond contact shield 230 may have only 1.5 or 2 times the surface area of the top of the element to be protected (e.g., the top 222T of metal contact 222). As such, much (and in some embodiments more than 95 percent, 98 percent or even 99 percent) of the surface of the device being fabricated is not covered by diamond contact shield 230, and thus the surface of the device being fabricated remains exposed and available for further processing. Such a diamond contact shield 230 may be known as a "diamond button." An embodiment of a diamond button 230 is schematically illustrated, in plan view, in FIG. 11F, in which metal contact 222 is illustrated as being visible through diamond button 230. Although metal contact 222 is shown as roughly square in shape, other shapes are possible, and may include longer rectangular shapes, such as metal or other conductive interconnection structures, to name but a few examples.

Further processing of the MEMS structure layer 221 may then be performed. For example, the MEMS structure layer 221 may be patterned to leave the desired MEMS beam 224 (step 115; FIG. 2Q).

Subsequently, the method 100 removes the sacrificial layer 211 (step 116; FIG. 2R), which releases the MEMS beam 224. In some embodiments, the sacrificial layer 211 may be removed by exposure to vapor HF, for example. It is known that vapor HF attacks various metals, and so vapor HP would attack and damage, and possibly destroy, the metal contact 222 if the metal contact 222 were not shielded, for example by the contact shield 230. Similarly, the etchant, such as vapor HF, might otherwise attack the second passivation layer 205 but for the intervening diamond shield.

After the sacrificial material is removed, the method 100 removes the contact shield 230 (step 117; FIG. 2S). As schematically illustrated in FIGS. 2P-2S for example, the contact shield 230 is removed at a point in the process 100 at which the MEMS beam 224 has previously been released; in other words, the MEMS beam 224 is already movable with respect to the substrate 201.

In some embodiments, the contact shield 230 may be removed by exposure to oxygen plasma, for example. In some embodiments, removal of the contact shield 230 also removes the diamond shield layer 210. However, in some embodiments (FIG. 2T), the diamond shield layer 210 may be retained, for example by covering it with another passivation layer prior to removal of the contact shield 230 at step 117. Retention of the diamond shield layer 210 may be desirable because the diamond shield layer 210 may have properties (such as low surface energy, for example) that mitigate potential stiction that might otherwise occur between the beam 224 and the second passivation layer 205, for example.

As schematically illustrated in FIG. 2S or 2T, the MEMS beam 224 is suspended above, and movable with respect to, the substrate 201, and includes an uncovered metal contact 222, which metal contact 222 is accessible for attachment of a wirebond 240, for example, by which the device 200 may be electrically coupled to circuits and systems external to the device 200.

As illustrated by the embodiments above, a MEMS device (e.g. 200) may be fabricated to include one (or more) exposed metal contacts 222. Generally, the method or methods used to fabricate the various components of the device 200, as well as to fabricate and remove various sacrificial layers (e.g., the sacrificial layer 211) and non-permanent components (e.g., the contact shield 230) are compatible, in that an existing layer or component is not materially affected (e.g., destroyed, removed, or changed in a manner or to a degree that renders it incapable of performing its intended function) by subsequent process steps or materials used in subsequent process steps, unless of course such subsequent process steps are performed, or subsequently used materials used, for the purpose of having such an impact.

Silicon-on-Insulator ("SOI") Base

Figure 3A:
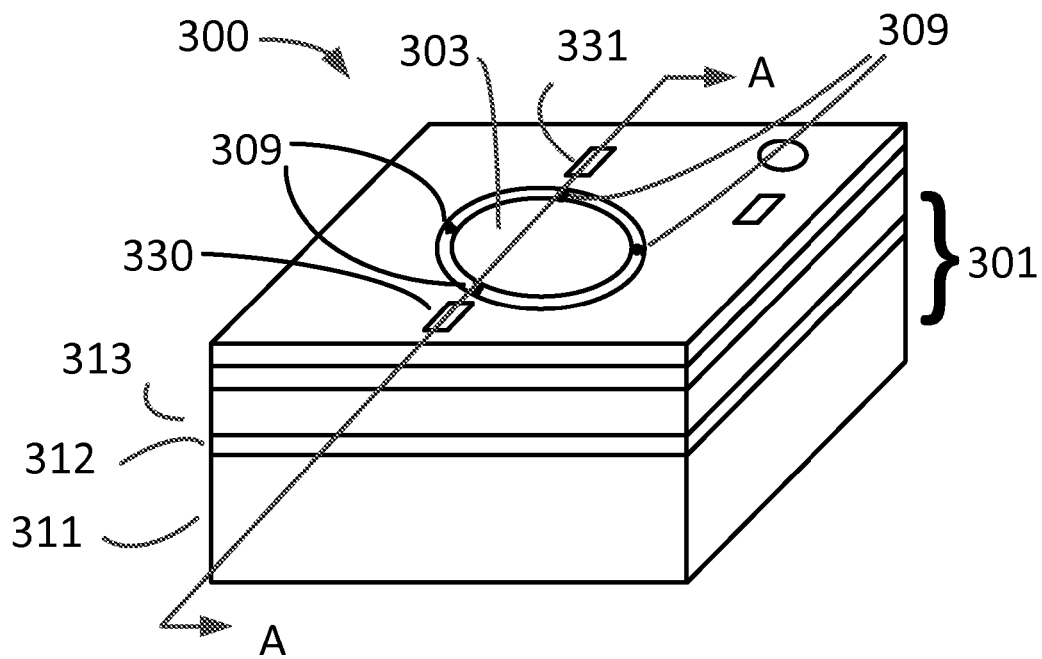
FIGS. 3A and 3B schematically illustrate a MEMS microphone.

Some MEMS devices are fabricated on or from a Silicon-on-Insulator (or "SOT") wafer, such as the SOT wafer 301 in FIG. 3A. A typical SOT wafer 301 has a base layer, sometimes known as a "handle layer" 311. The handle layer 311 may be silicon, for example. The SOT wafer 301 also has a top layer, sometimes known as a "device" layer 313, coupled to one side of the handle layer 311 by an insulator layer 312. The device layer 313 may be doped or un-doped silicon, for example, and may be thinner than the handle layer 311. The insulator layer 312 may be an oxide, and is sandwiched between the handle layer 311 and the device layer 313.

Figure 3B:
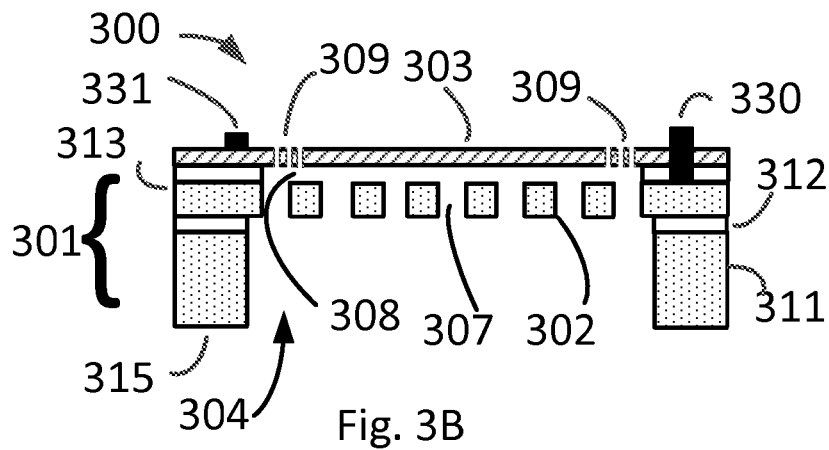

To further illustrate such devices, FIG. 3A schematically illustrates a top, perspective view of a MEMS microphone chip 300. FIG. 3B schematically shows a cross-sectional view of a MEMS microphone chip 300 along section A-A. Microphone chip 300 is discussed to detail some exemplary components of a MEMS microphone.

As shown in FIGS. 3A and 3B, the microphone chip 300 has the chip base/substrate—SOI wafer 301, one portion of which supports a backplate 302. The microphone 300 also includes a flexible diaphragm 303 that is movable relative to the backplate 302. The diaphragm 303 is suspended by springs 309, and the backplate 302 and diaphragm 303 are separated by a gap 308, and together form a variable capacitor across gap 308.

In some microphones, the backplate 302 is formed from single crystal silicon (e.g., a part of the device layer 313), while the diaphragm 303 is formed from deposited polysilicon. In other embodiments, however, the backplate 302 and diaphragm 303 may be formed from different materials.

In the embodiment shown in FIG. 3B, the microphone substrate 301 includes the backplate 302 and other structures, such as a bottom wafer 311 and a buried oxide layer 312 of an SOI wafer. A portion of the substrate 301 also forms a backside cavity 304 extending from the bottom 315 of the substrate 301 to the bottom of the backplate 302. To facilitate operation, the backplate 302 has a plurality of through-holes 307 that lead from gap 308 (i.e., a gap between the diaphragm 303 and backplate 302) to the backside cavity 304. As such, the diaphragm 303 is exposed through the backside cavity 304. One or more terminals 330, 331 may electrically couple features of the microphone to circuitry on the MEMS device, or external circuitry. For example, in the embodiment of FIGS. 3A and 3B, the terminal 330 is electrically coupled to the backplate 302, and the terminal 331 is electrically coupled to the diaphragm 303.

It should be noted that various embodiments are sometimes described herein using words of orientation such as "top," "bottom," or "side." These and similar terms are merely employed for convenience and typically refer to the perspective of the drawings. For example, the substrate 301 is below the diaphragm 303 from the perspective of FIGS. 3A and 3B. However, the substrate 301 may be in some other orientation relative to the diaphragm 303 depending on the orientation of the MEMS microphone 300. Thus, in the present discussion, perspective is based on the orientation of the drawings of the MEMS microphone 300.

In operation, acoustic signals strike the diaphragm 303, causing it to vibrate, thus varying the gap 308 between the diaphragm 303 and the backplate 302 to produce a changing capacitance. The diaphragm may generally move in a plunger-like motion, in which the diaphragm 303 remains parallel to the backplate 302 as it moves towards, or recedes from, the backplate 302.

Figure 3C:
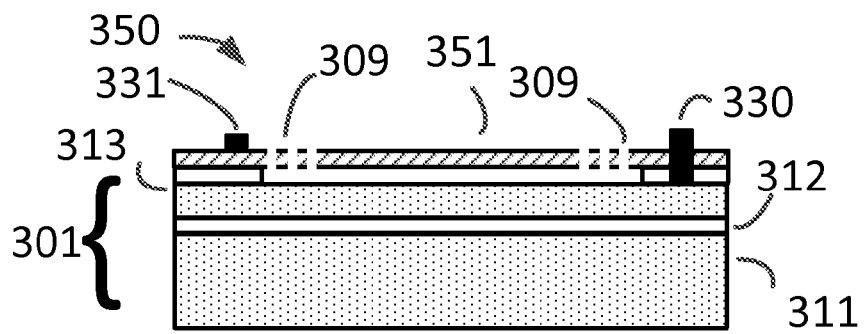
FIG. 3C schematically illustrates a MEMS device, such as an accelerometer or a gyroscope.
Figure 4:
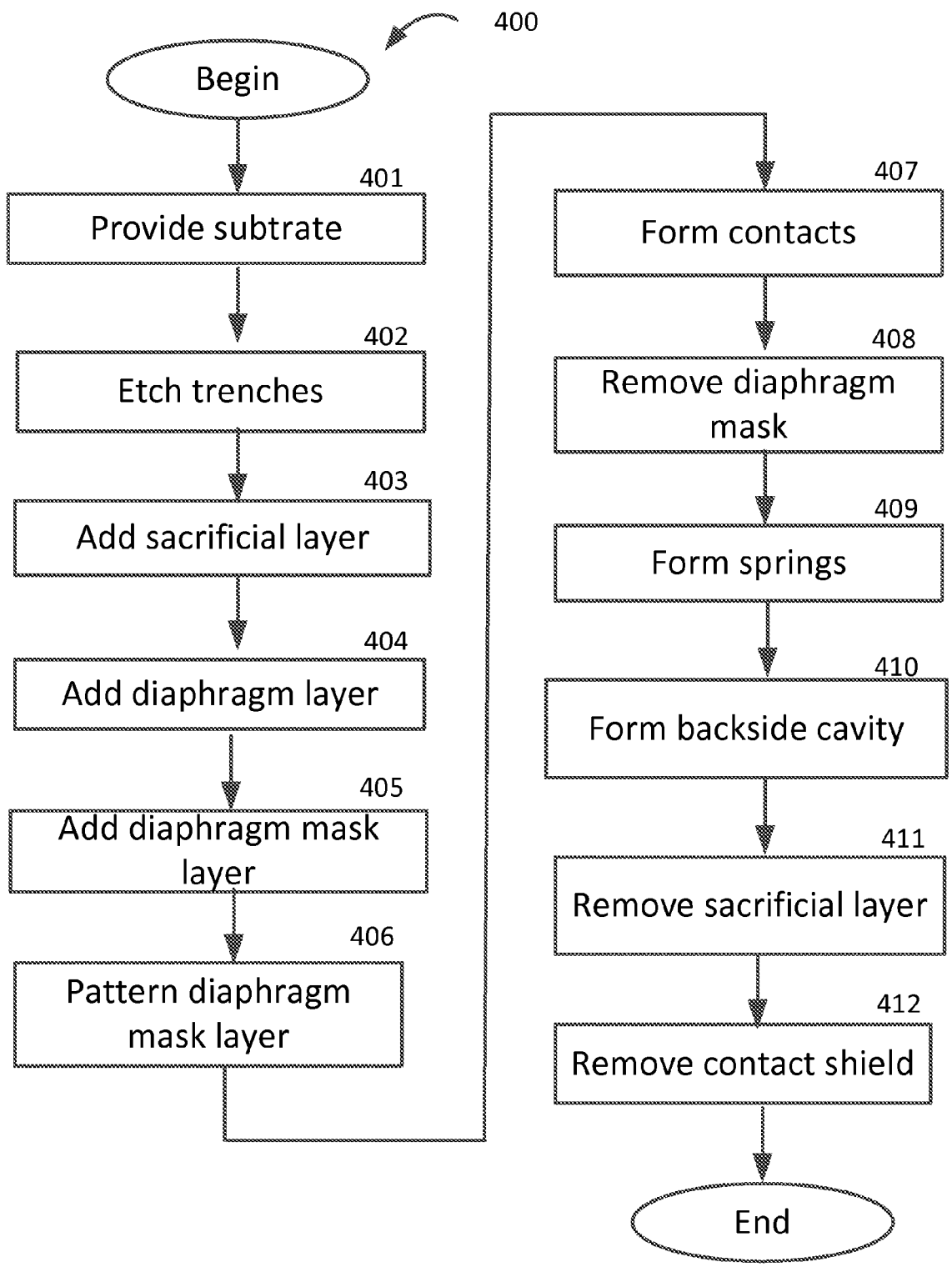
FIG. 4 illustrates a method of forming a MEMS device with a silicon-on-insulator wafer and using diamond shielding.

Although FIGS. 3A and 3B schematically illustrate a microphone 300, in which the suspended MEMS structures include the diaphragm 303 and the springs 309, other MEMS devices may have a movable mass other than a diaphragm. For example, in the device 350 schematically illustrated in FIG. 3C, the movable mass 351 may be the proof mass of an accelerometer or gyroscope, for example. For purposes of illustration, however, the microphone 300 of FIGS. 3A and 3B and a method 400 for fabricating such a microphone 300 are described in more detail below, with the understanding that the principles also apply to other MEMS devices, such as accelerometers and gyroscopes for example.

Figure 5A:
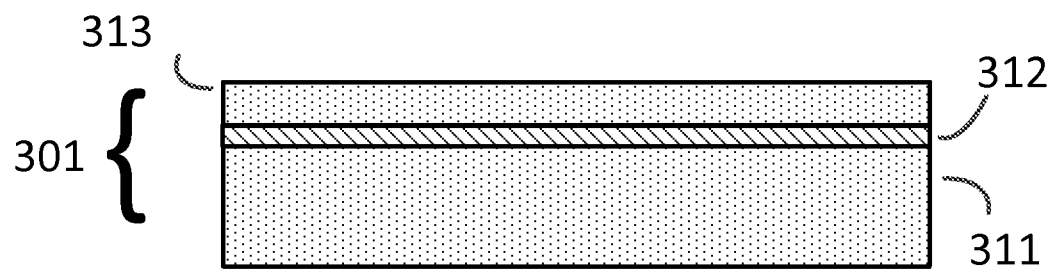
FIGS. 5A-5K schematically illustrate MEMS device at various stages of fabrication according to the method of FIG. 4.
Figure 5B:
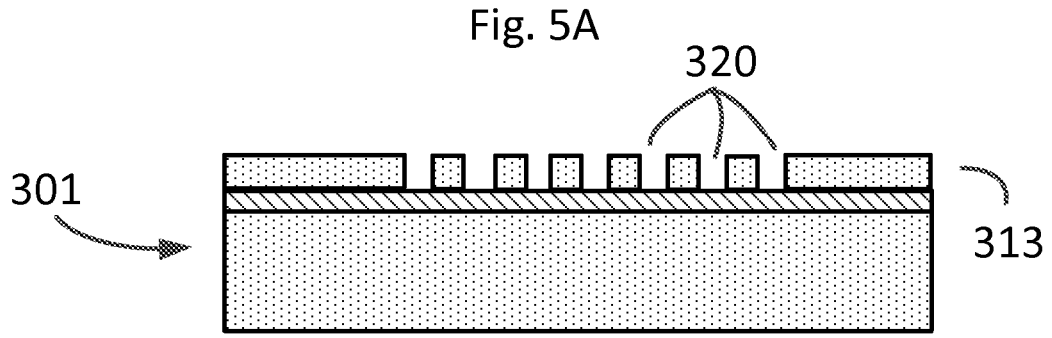

The method 400 begins by providing a silicon-on-insulator substrate 301 (step 401; FIG. 5A) and etching throughhole trenches 320 into the device layer (step 402; FIG. 5B). The throughhole trenches 320 will later form througholes in the backplate of the microphone 300.

Figure 5C:
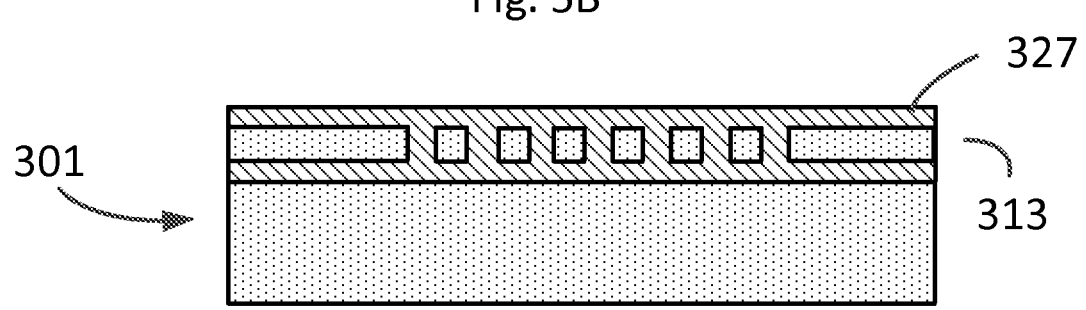

At step 403, a layer 327 of sacrificial material (i.e., sacrificial layer 327) is deposited on the device layer 313, and the sacrificial layer 327 lines or fills the throughhole trenches 320 (FIG. 5C). In some embodiments, the sacrificial material 327 may be an oxide, for example.

Figure 5D:
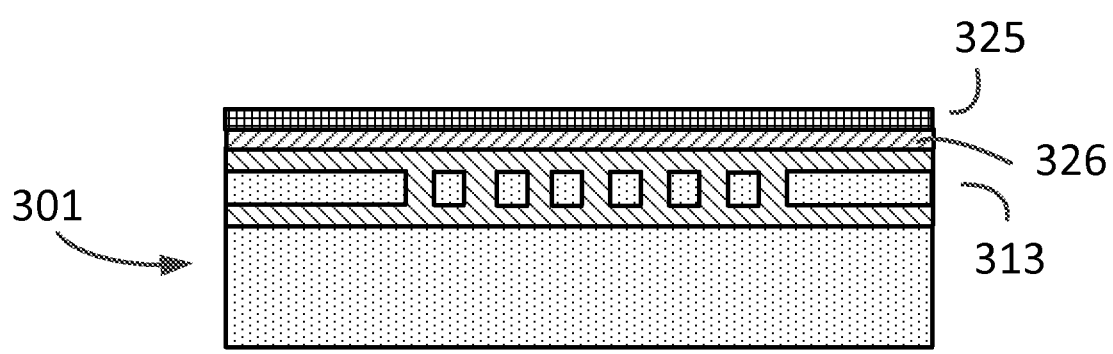

The method 400 deposits a diaphragm layer 326 on the sacrificial layer 327 at step 404. As schematically illustrated in FIG. 5D, the diaphragm layer 326 is spaced from the device layer 313 by the sacrificial layer 327. Next, a diaphragm mask layer 325 is deposited on the diaphragm layer 326, at step 405 (FIG. 5D).

Figure 5E:
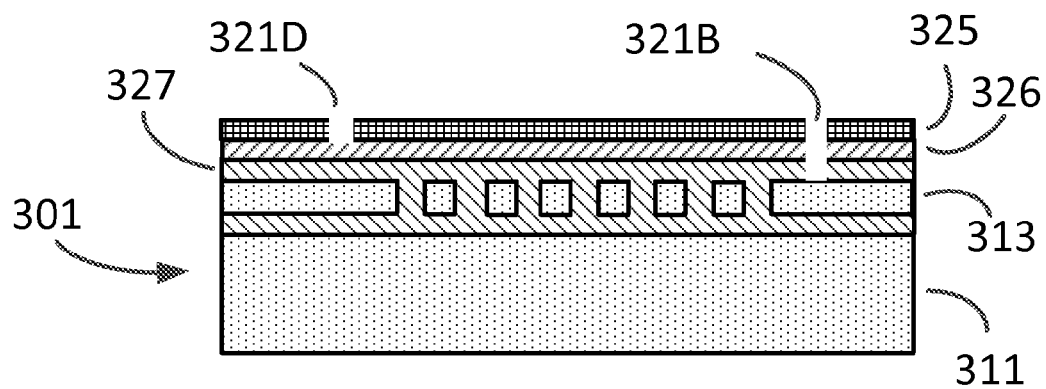
Figure 5F:
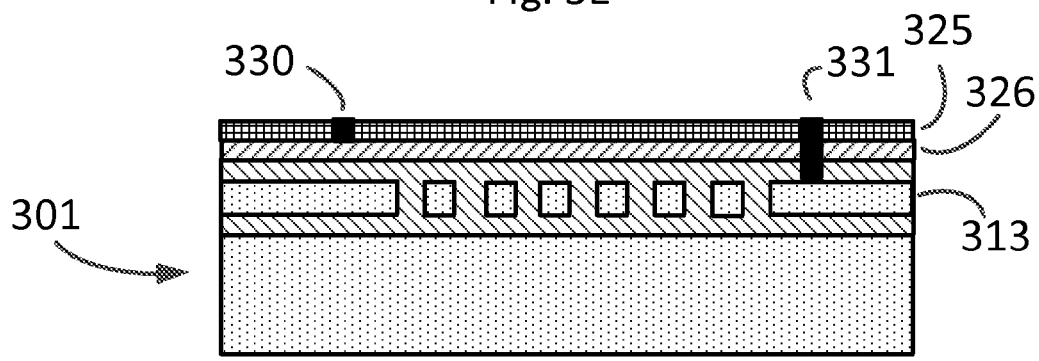
Figure 5G:
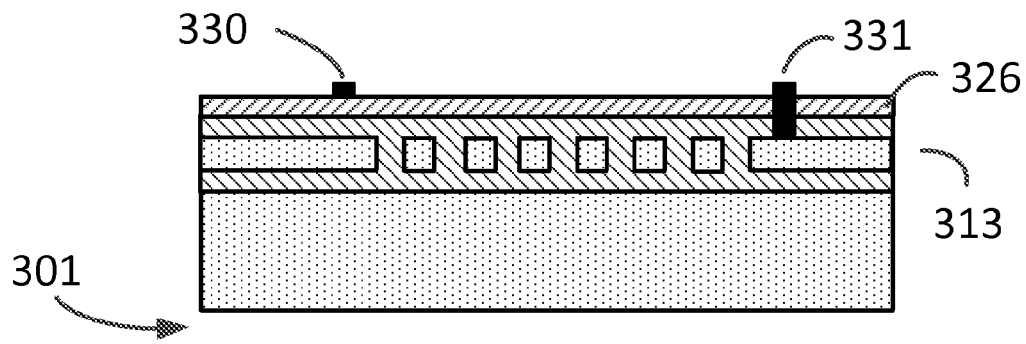

Later, the diaphragm mask layer 325 is patterned to form two contact trenches (step 406; FIG. 5E). In the embodiment schematically illustrated in FIG. 5E, a diaphragm trench 321D extends through the diaphragm mask layer 325 to expose the diaphragm layer 326, and a backplate trench 321B extends through the diaphragm layer 326 and the sacrificial layer 327 to the device layer 313, and thereby to the backplate. Subsequently, metal is deposited at step 407 to form contacts 330 and 331 (FIG. 5F). The diaphragm mask 325 is then removed at step 408 (FIG. 5G).

To protect the contacts 330, 331, diamond contact shields 230 are fabricated to cover the contacts 330, 331. The contact shields 230 and their fabrication are similar to those described above. In alternate embodiments, a diamond layer may be fabricated to cover the contacts 330, 331, as shown in FIG. 8 and FIGS. 9A-9H for example.

Figure 5H:
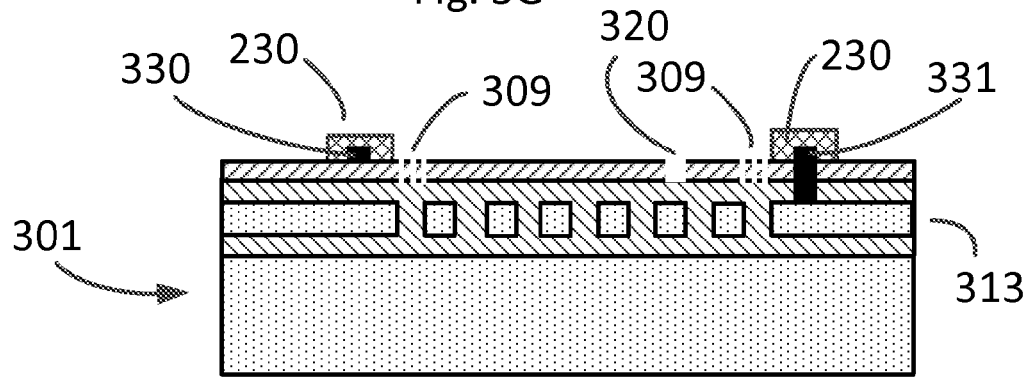

Next, springs 309 may be formed from the diaphragm layer 326, at step 409 (FIG. 5H), by materials processes known in the art. For example, a mask layer may be added to the diaphragm layer 326 and springs 309 formed by patterning the diaphragm layer 326 through the mask layer. In addition, one or more diaphragm layer 326 apertures 320 may be formed through the diaphragm layer 326 for use in subsequent process steps.

Figure 5I:
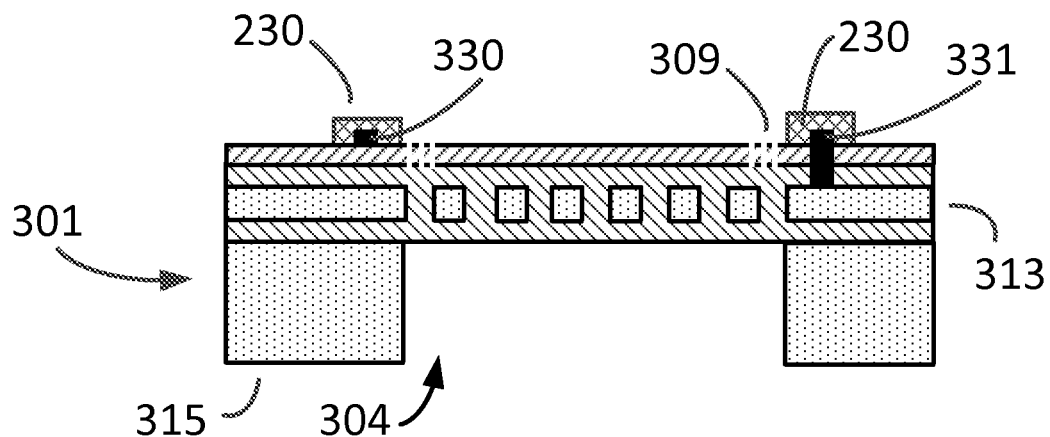

A backside cavity is formed at step 410 (FIG. 5I), by processes known in the art. For example, a backside cavity may be formed by depositing and patterning a mask layer on the backside 315 of the wafer 301, and then etching the backside cavity through the handle layer 311 to the buried oxide layer 312.

Figure 5J:
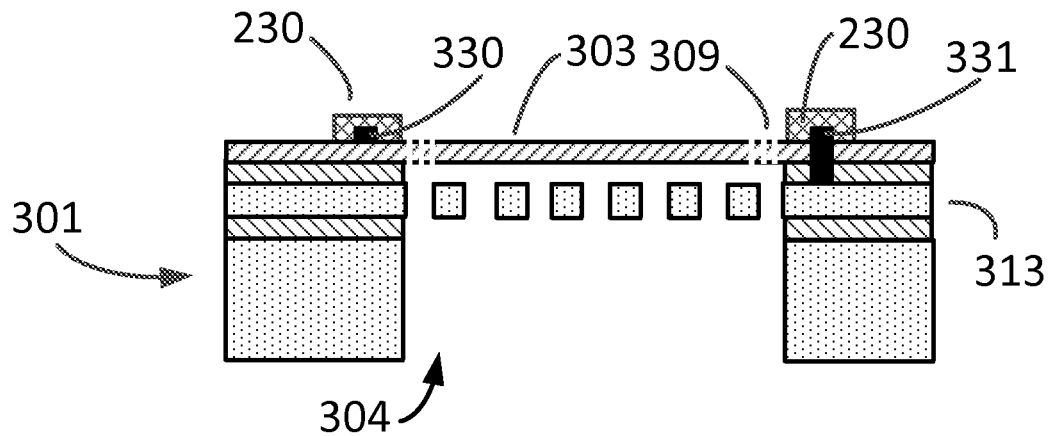

Portions of the sacrificial layer 327 and the buried oxide layer 312 of substrate 301 are then removed, for example by a wet or a dry etch process at step 411 (FIG. 5J). In some embodiments, sacrificial layer 327 and the buried oxide layer 312 of substrate 301 are removed by etching, for example with vapor HF. In some embodiments, the sacrificial layer 327 and the buried oxide layer 312 of substrate 301 may be removed by applying an etchant through one or more diaphragm layer apertures 320 through the diaphragm layer 326. Alternately, the sacrificial layer 327 and the buried oxide layer 412 of substrate 301 may be removed by etching them through the backside cavity 304 formed at step 410. Generally, removing the buried oxide layer 312 or other sacrificial layer releases a MEMS structure (e.g., diaphragm 303) such that the MEMS structure is or becomes movable with respect to a substrate (wafer 301).

Figure 5K:
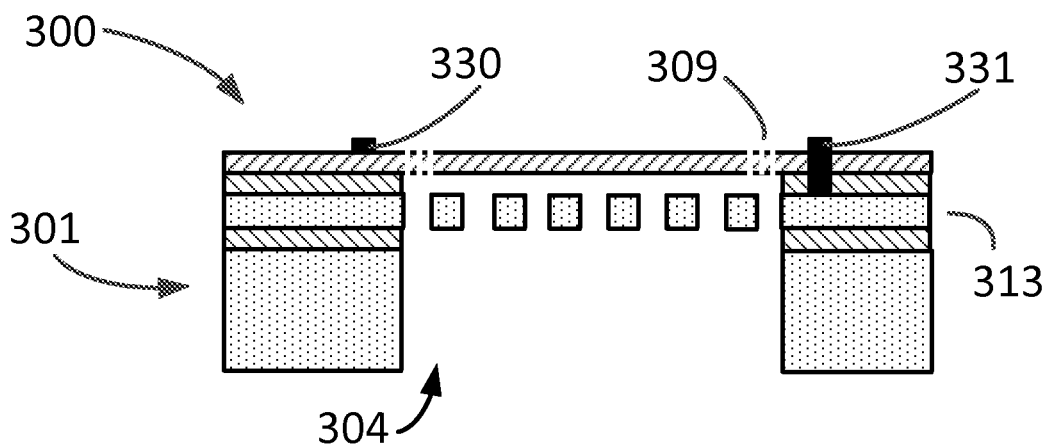

In addition, the contact shields 230 are removed, as described above, at step 412. In this embodiment, as in other embodiments, the diamond contact shields 230 are removed after the MEMS structure (e.g., the diaphragm 303) has been released. As such, FIG. 5K schematically illustrates a microphone 300 with a movable diaphragm 303 and exposed metal contacts 330, 331.

While some embodiments build layers above the surface of an SOI wafer, in other embodiments a variety of MEMS devices may be fabricated from the device layer 313 of an SOI wafer itself, for example by etching away portions of the device layer 313 to form one or more MEMS structures. The MEMS structures may then be released by removing the insulator layer 312 between the MEMS structures and the base layer 311.

Figure 6:
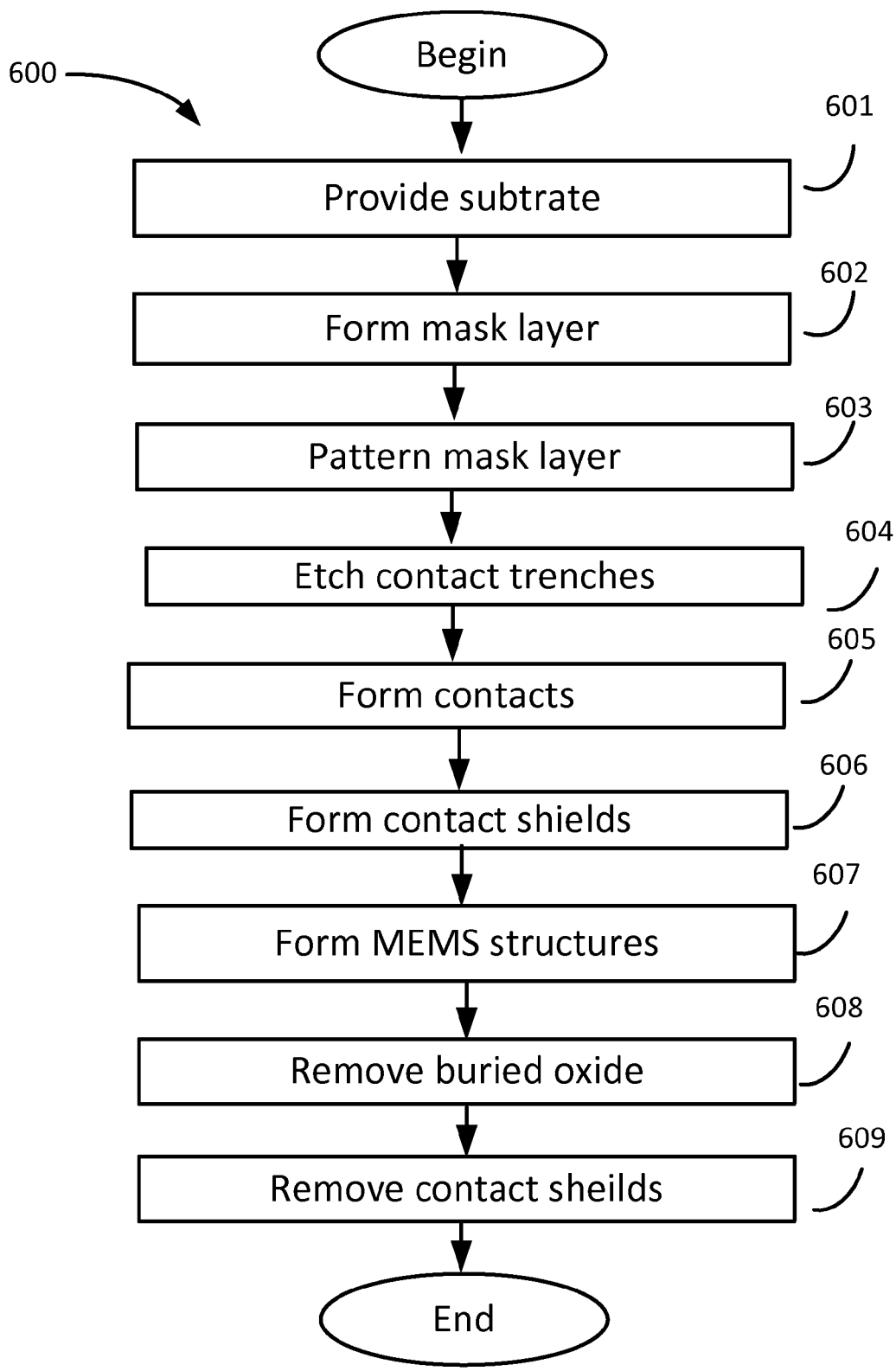
FIG. 6 illustrates a method of forming a MEMS device with a silicon-on-insulator wafer and using diamond shielding.

For example, FIG. 6 illustrates a method 600 of forming a MEMS accelerometer 700, and the accelerometer 700 is schematically illustrated a various stages of fabrication in FIGS. 7A-7H.

The method 600 begins by providing an SOI wafer (step 601; FIG. 7A), and forming a beam mask layer 701 on the device layer (step 602; FIG. 7B). The method 600 patterns the beam mask layer 701 at step 603 in locations where a substrate contact 710 and a beam contact 711 will later be fabricated (FIG. 7B). As schematically illustrated in FIG. 7B, a beam contact trench 711A extends through the beam mask layer 701 to the device layer.

At step 604, the method 600 etches a substrate contact trench 710A through the device layer 313 and buried oxide layer 312 where a substrate contact 710 will later be fabricated (FIG. 7C). As such, the substrate contact trench 710A extends through the beam mask layer 701, the device layer 313, and the intermediate oxide layer 312, to the handle layer 311, and the beam contact trench 711A extends through the beam mask layer to the buried oxide layer.

Figure 7E:
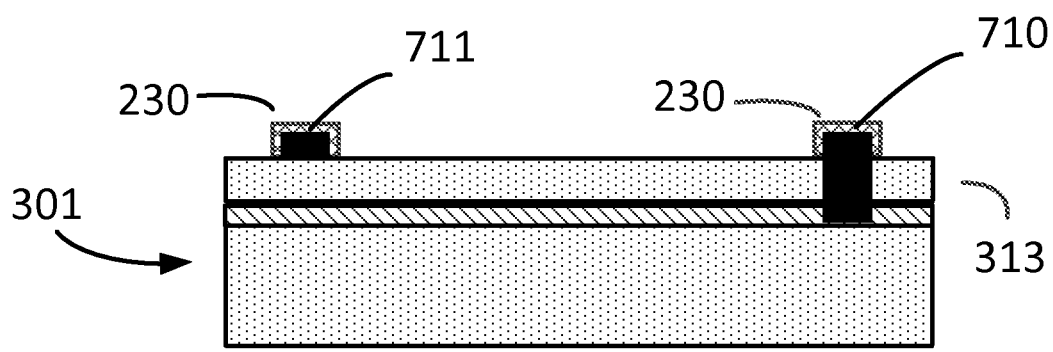

At step 605, the method forms the substrate contact 710 and the beam contact 711 by depositing metal into the substrate contact trench 710A and the beam contact trench 711A, as schematically illustrated in FIG. 7D. To protect the substrate contact 710 and the beam contact 711, the method 600 forms a contact shield (e.g, a diamond contact shield 230) over the substrate contact 710 and the beam contact 711, at step 606, as schematically illustrated in FIG. 7E.

Figure 7F:
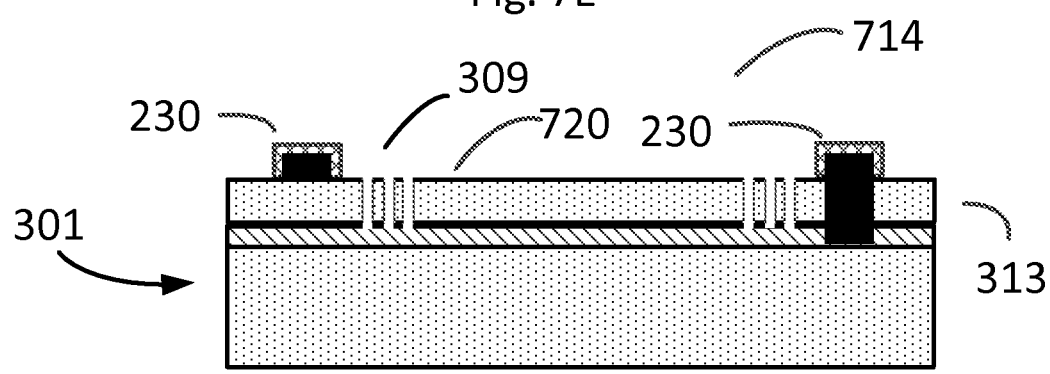
Figure 7G:
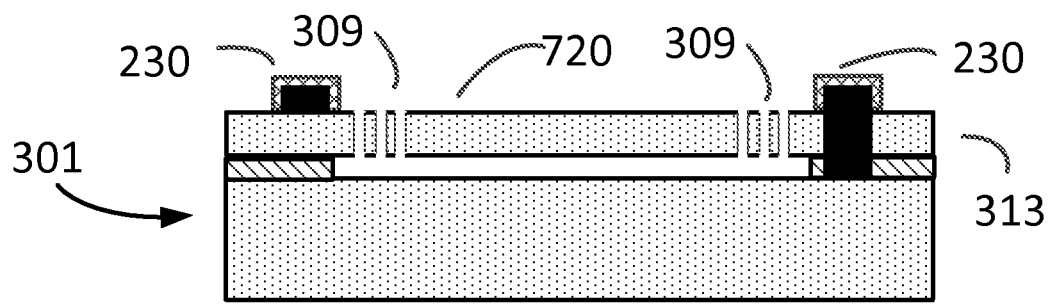
Figure 7H:
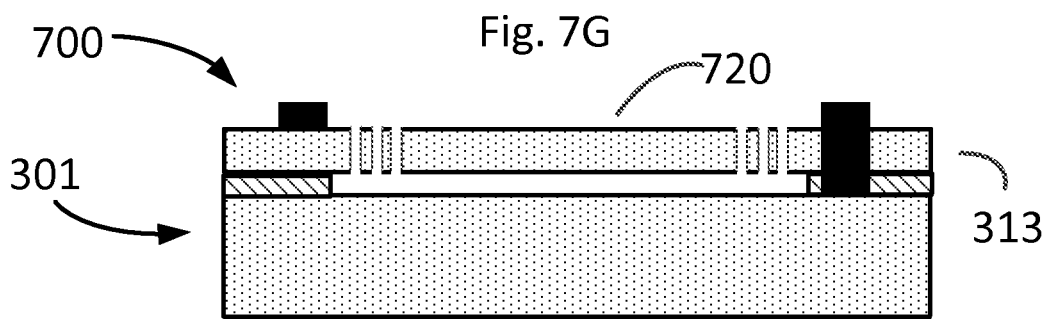

Next, MEMS accelerometer structures 714 are formed at step 607, as schematically illustrated in FIG. 7F. For example, springs 309 may be formed from the device layer 313 by etching device layer 313 in ways known in the art, to define the accelerometer beam 720 as the portion of the device layer 313 between the springs 309. At step 608, at least some of the buried oxide layer 312 beneath the accelerometer beam 720 is removed (FIG. 7G). For example, in some embodiments, the accelerometer beam 720 is released by removing the buried oxide layer 312 that is sandwiched between the accelerometer beam 720 and the handle layer. The diamond contact shields 230 are then removed at step 609 (FIG. 7H).

Figure 8:
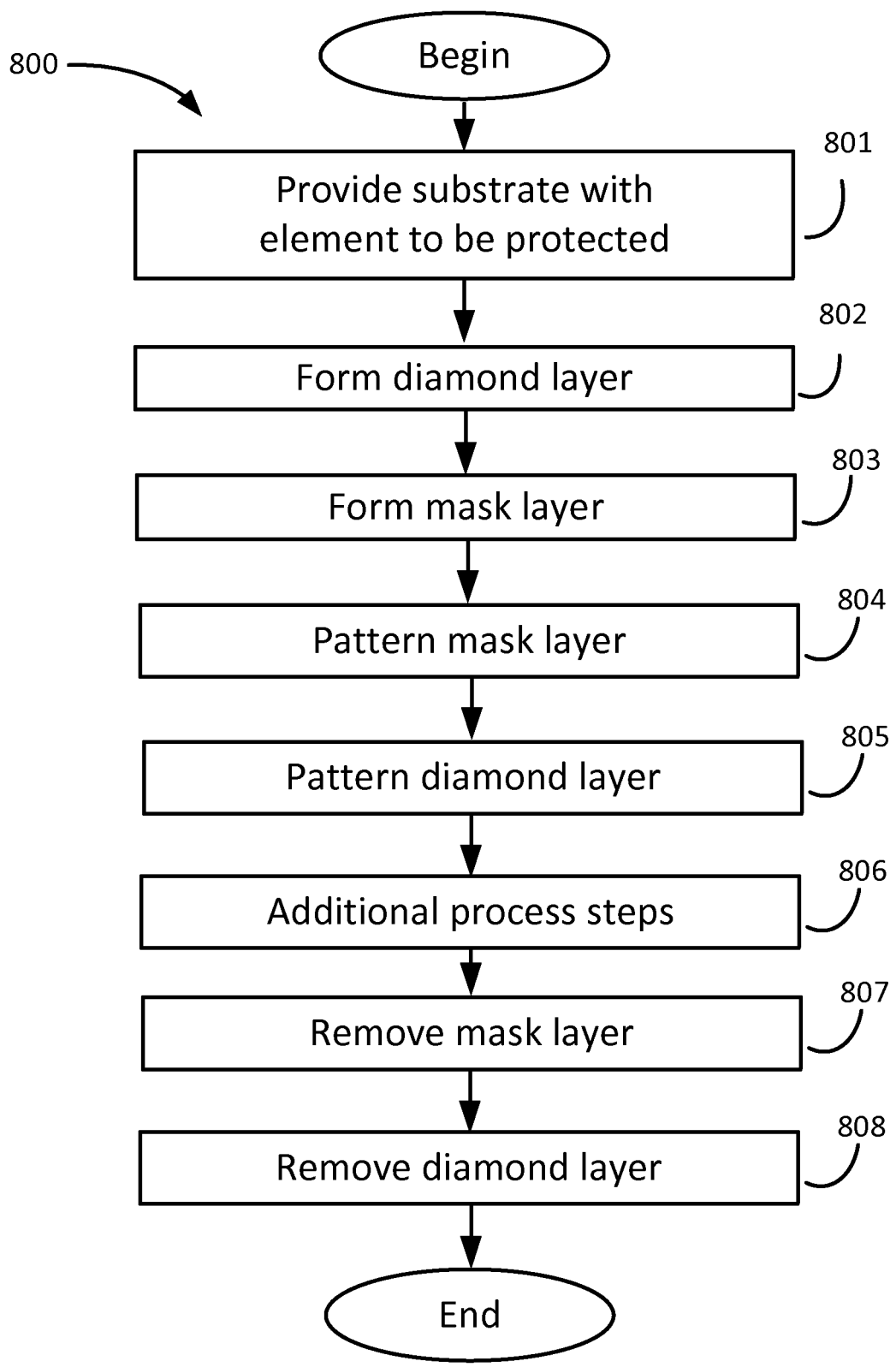
FIG. 8 illustrates a method of forming a diamond shield layer.

An additional embodiment of a method 800 forming and using a diamond shield layer is schematically illustrated in FIG. 8, and a device at various stages of fabrication is schematically illustrated in FIGS. 9A-9H.

Figure 9A:
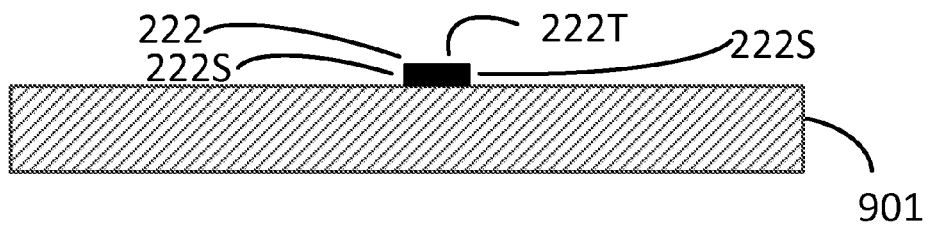

The method 800 begins with a substrate 901 having an element 222 to be protected (step 801; FIG. 9A). The substrate may be silicon, part of an SOI wafer, or part of a MEMS structure, for example. The element 222 to be protected may be a metal contact or interconnect, a MEMS structure, a circuit or other element, to name but a few illustrative examples.

Figure 9B:
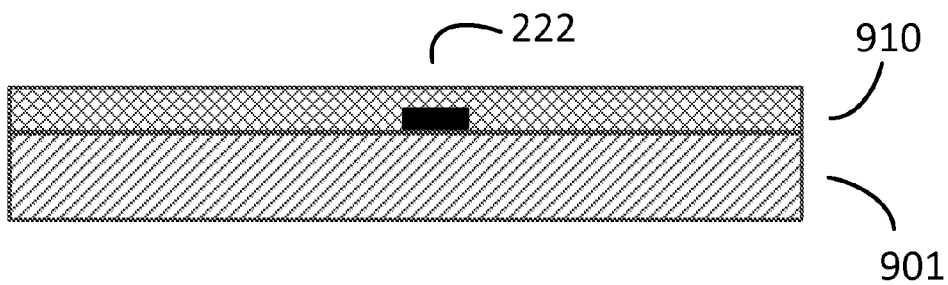

At step 802, a diamond shield layer 910 is fabricated to cover the element 222 to be protected (FIG. 9B). As noted above, the diamond shield layer 910 may be fabricated by a variety of processes. For example, in various embodiments the diamond film 910 may be fabricated or prepared by microwave plasma chemical vapor deposition (CVD), hot filament CVD, plasma enhanced CVD, or a spin-coating method followed by anneal. The deposition (or growth) temperature may be between 300° C.-1000° C. In some embodiments, the temperature at which the diamond film 910 is fabricated may be chosen towards the lower end of the scale, such that the heat does not damage features (e.g., the element to be protected) fabricated prior to the fabrication of the diamond film 910.

Figure 9C:
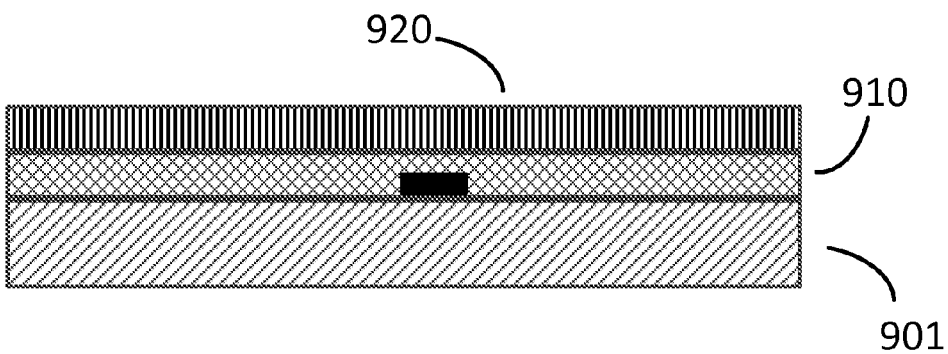
Figure 9D:
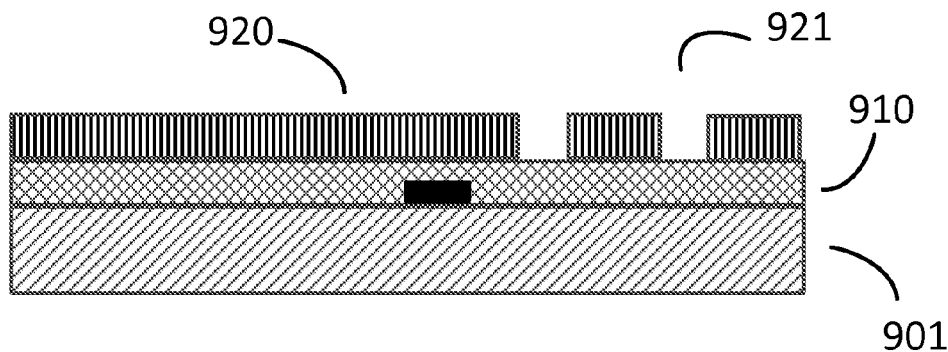

A mask layer 920 is formed above the diamond shield layer 910 at step 803 (FIG. 9C), and is patterned at step 804 (FIG. 9D). The mask layer 920 may be, for example, photoresist. In some embodiments, the mask layer 920 may be oxide, or other material that is not subject to etching by oxygen plasma (e.g., an "oxygen plasma resistant material").

Next, the diamond shield layer 910 is patterned through the mask layer 920, at step 805 (FIG. 9E). In this illustrative embodiment, the mask layer 920 and diamond shield layer 910 are patterned to provide etch holes in places where the substrate is to be etched. As such, step 806 involves etching or otherwise processing the substrate layer 901, as schematically illustrated in FIG. 9F. In this embodiment, apertures 922 have been formed in the substrate 901. These apertures 922 may, for example, be etch holes (such as etch hole 320 in FIG. 5H, for example), or may help define MEMS structures, such as springs 309 in FIG. 5H for example. Other possible fabrication steps may include removing a sacrificial oxide layer, for example through an etch hole 320 as in FIG. 5H, for example. Ultimately, the mask layer 920 is removed at step 807 (FIG. 9G) and the diamond shield layer 910 is removed at step 808 (FIG. 9H).

Figure 10:
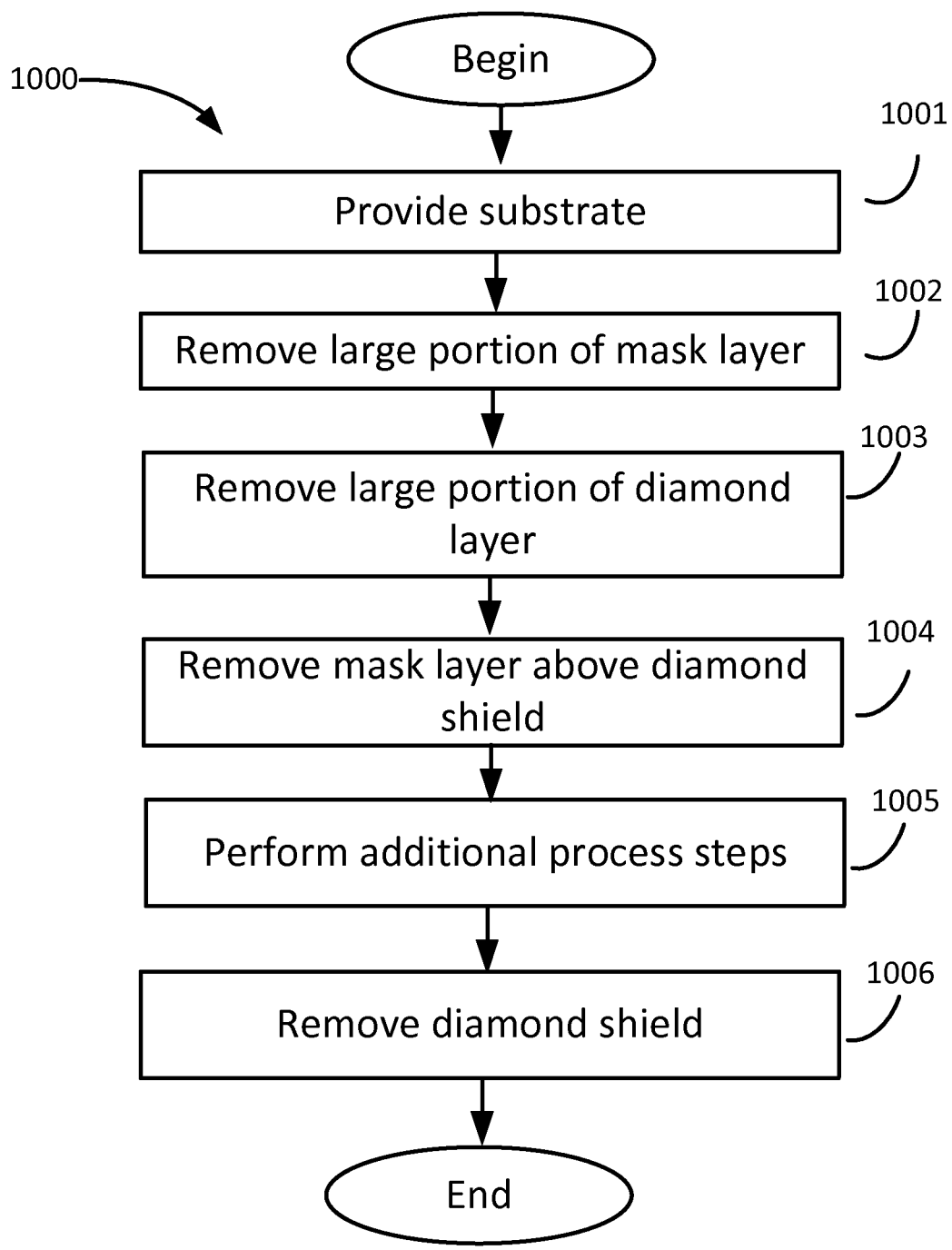
FIG. 10 illustrates a method of forming a diamond shield structure.

In an alternate embodiment, a process 1000 (FIG. 10) of forming a smaller diamond shield (such as diamond shield 230, for example) removes most of the diamond layer 910. For example, FIGS. 11A-11E schematically illustrate a MEMS device 1150 at various stages of fabrication, including a diamond shield 230. This illustrative process 1000 begins by providing (step 1001) a substrate 901 having an element to be protected 222 and a diamond shield layer 910, and a mask layer 920 (FIG. 11A), such as schematically illustrated in FIG. 9C for example. A large portion (for example, 50 percent, 60 percent, 70 percent, 80 percent, 90 percent or more) of the mask layer 920 is removed (step 1002) to expose the diamond shield layer 910, so as to leave a small mask 921 covering the diamond layer above the element to be protected 222 (FIG. 11B).

Next, a large portion (for example, most) the diamond shield layer 910 is removed (step 1003), for example by exposure to Vapor HF), except where protected by the small mask 921. For example, some embodiments may remove 50 percent, 60 percent, 70 percent, 80 percent, 90 percent or more of the diamond shield layer 910.

When the small mask 921 is removed (step 1004), only the diamond shield 230 remains (FIG. 11D), to protect the element to be protected 222. In some embodiments, removing the majority of (or a large portion of) the diamond shield layer 910 exposes a large portion (even most of) the features or surfaces the device being fabricated, which enables or facilitates other process steps (e.g., patterning a MEMS device or removing sacrificial material, for example). As such, additional process steps may be performed (step 1005) while the element to be protected 222 is encapsulated between the substrate 901 and the diamond shield 230 (FIG. 11D). Later, the diamond shield 230 is removed (step 1006), to expose the element to be protected 222 (FIG. 11E). AS illustrated above, in some embodiments the diamond shield or diamond button 230 is removed after a MEMS structure is released.

As shown in the various embodiments, a diamond layer or film can protect features of a MEMS device during fabrication of the MEMS device. In some embodiments, a diamond layer or diamond shield is formed to protect (e.g., cover or surround or encapsulate) a feature before a MEMS structure (e.g., a beam or cantilevered structure) is formed, while in other embodiments a diamond layer or diamond shield is formed to protect a feature after a MEMS structure is partially formed, but before it is completed or released. The diamond layer or diamond shield is removed after the MEMS structure is released.

For example, in one embodiment, a method of forming a MEMS device may include forming a metal contact on or above the first side of a substrate, and then providing a diamond layer on the metal contact; in addition to forming a sacrificial layer on or above the first side of the substrate, forming a MEMS structure on the sacrificial layer such that the sacrificial layer is between the MEMS structure and the substrate, and etching the sacrificial layer with an etchant, such that at least a portion of the sacrificial layer between the MEMS structure and the first side of the substrate is removed prior to removing the diamond layer on the metal contact. In various embodiments, the metal contact and diamond layer may be formed before the MEMS structure is formed (or before the first portion of the MEMS structure is formed), or after the MEMS structure is formed (or after the first portion of the MEMS structure is formed).

As used herein, the term "above," when used to describe the relative locations of two or more features, may describe the locations of those features with respect to a substrate. For example, if a first element is "above" a second element, then the second element is closer to the substrate than the first element. Indeed, in some embodiments, the second element may be between the first element and the substrate.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A method of forming a micro-electromechanical systems (MEMS) device, comprising:
   providing a substrate having a first side and a second side;
   forming an electrode on or above the first side of the substrate;
   providing a diamond layer on the electrode;
   forming a sacrificial layer on or above the first side of the substrate;
   forming a MEMS structure on the sacrificial layer such that the sacrificial layer is between the MEMS structure and the substrate; and
   releasing the MEMS structure by etching the sacrificial layer with an etchant, such that at least a portion of the sacrificial layer between the MEMS structure and the first side of the substrate is removed prior to removing the diamond layer on the electrode.

2. The method of forming a MEMS device according to claim 1, the method further comprising removing at least a portion of the diamond layer after etching the sacrificial layer.

3. The method of forming a MEMS device according to claim 1, wherein the diamond layer is not etched by the etchant.

4. The method of forming a MEMS device according to claim 3, wherein the etchant is vapor HF.

5. The method of forming a MEMS device according to claim 2, wherein removing at least a portion of the diamond layer comprises removing at least a portion of the diamond layer by exposing the diamond layer to oxygen plasma.

6. The method of forming a MEMS device according to claim 1, wherein forming a electrode on or above the first side of the substrate comprises forming an electrode through the top layer of a silicon-on-insulator wafer.

7. The method of forming a MEMS device according to claim 1, wherein forming an electrode on or above the first side of the substrate comprises forming an electrode on the MEMS structure after forming the MEMS structure on the sacrificial layer.

8. The method of forming a MEMS device according to claim 1, wherein providing a diamond layer on the electrode comprises:
   depositing a diamond layer on the MEMS structure and on the electrode; and
   removing the majority of the diamond layer to leave a portion of the diamond layer on the electrode.

9. The method of forming a MEMS device according to claim 1, wherein providing a diamond layer comprises depositing a diamond layer via one of microwave plasma chemical vapor deposition, hot filament chemical vapor deposition, and microwave plasma enhanced vapor deposition.

10. The method of forming a MEMS device according to claim 1, wherein providing a diamond layer comprises depositing a diamond layer via a spin coating method.

11. The method of forming a MEMS device according to claim 1, wherein providing a diamond layer comprises forming a diamond layer with a thickness of between 50 nm and 1,000 nm.

12. The method of forming a MEMS device according to claim 1, wherein providing a diamond layer comprises forming a carbon layer having a nanocrystalline structure or a microcrystalline structure.

13. The method of forming a MEMS device according to claim 1, wherein providing a diamond layer comprises forming a carbon layer having an ultrananocrystalline structure.

14. The method of forming a MEMS device according to claim 1, wherein providing a diamond layer comprises forming a carbon layer having a polycrystalline structure.

15. A method of forming a micro-electromechanical systems (MEMS) device, comprising:
   providing a silicon-on-insulator substrate, the silicon-on-insulator substrate comprising a handle layer, a device layer, and a buried oxide layer sandwiched between the handle layer and the device layer;
   forming an electrode on or through the device layer, the electrode having an electrode top surface area;
   covering the electrode with a diamond button, the diamond button having a top button surface area no more than twice the electrode top surface area; and
   removing at least a portion of the buried oxide layer by exposing the buried oxide layer to vapor hydrogen fluoride (HF).

16. The method of forming a MEMS device of claim 15, wherein:
   covering the electrode with a diamond button comprises depositing a diamond layer above the device layer, such that the device layer is between the diamond layer and the buried oxide layer, and removing most of the diamond layer except a portion of the diamond layer covering the electrode; and wherein
   removing at least a portion of the buried oxide layer comprises patterning the diamond layer to form an aperture through the diamond layer to expose at least a portion of the device layer, and exposing at least a portion of the buried oxide layer to vapor HF through the device layer.

17. The method of forming a MEMS device of claim 15, wherein:
covering the electrode comprises depositing a diamond layer above the device layer, such that the device layer is between the diamond layer and the buried oxide layer; and wherein
removing at least a portion of the buried oxide layer comprises forming a backside cavity through the handle layer, and exposing at least a portion of the buried oxide layer to vapor HF through the backside cavity.

18. A method of forming a micro-electromechanical systems (MEMS) device, comprising:
providing a substrate having a first side and a second side;
forming a sacrificial layer on the first side of the substrate;
forming a MEMS structure on the sacrificial layer, such that the sacrificial layer is sandwiched between the MEMS structure and the substrate;
forming a metal element;
depositing a diamond layer covering the metal element and at least part of the sacrificial layer;
depositing an oxygen plasma resistant layer on the diamond layer;
patterning the oxygen plasma resistant layer to form apertures so as to expose at least a portion of the diamond layer above the sacrificial layer;
patterning the diamond layer to form release holes by exposing the diamond layer to oxygen plasma through the oxygen plasma resistant layer, so as to expose at least part of the sacrificial layer; and
removing at least a portion of the sacrificial layer by exposing the sacrificial layer to vapor hydrogen fluoride (HF).

19. A method of forming a MEMS device according to claim 18, wherein patterning the diamond layer further comprises forming a diamond button.

20. A method of forming a MEMS device according to claim 18, wherein the oxygen plasma resistant layer is an oxide.

* * * * *